United States Patent [19]

Sandland et al.

[11] Patent Number: 4,556,317

[45] Date of Patent: Dec. 3, 1985

[54] X-Y STAGE FOR A PATTERNED WAFER AUTOMATIC INSPECTION SYSTEM

[75] Inventors: Paul Sandland, Gilroy; Curt H. Chadwick, Los Altos; Howard I. Dwyer, Mountain View, all of Calif.

[73] Assignee: KLA Instruments Corporation, Santa Clara, Calif.

[21] Appl. No.: 582,582

[22] Filed: Feb. 22, 1984

[51] Int. Cl.[4] .............................................. G01B 11/00
[52] U.S. Cl. ..................................... 356/237; 356/73; 356/239
[58] Field of Search ................. 356/73, 237, 239, 244, 356/358

[56] References Cited

U.S. PATENT DOCUMENTS 4,185,298 1/1980 Billet et al. ........................... 356/106
4,240,750 12/1980 Kurtz et al. .......................... 356/394
4,448,532 5/1984 Joseph et al. ........................ 356/394

Primary Examiner—John E. Kittle
Attorney, Agent, or Firm—Hamrick, Hoffman et al.

[57] ABSTRACT

An automatic patterned wafer inspection system includes macro and micro inspection stations having optical axes that are 10 inches apart on an X-Y crossed roller stage which provides 7 inches of travel in each of two directions along two orthogonal axes. A macro-micro transport arm is pivotally interconnected with the stage and supports a turntable with a vacuum chuck centrally located thereon. The transport arm is positioned to move the wafer from a position 5 inches to the left of center of the stage (the macro axis) to a position 5 inches to the right of the center of the stage (the micro axis). Repeatability of positioning of the arms is obtained by using a spring-loaded link to drive the transport arm against a hard stop located at the left and right of the stage. The turntable is mounted so as to have an outside edge adjacent the distal end of the transport arm. A vacuum chuck for holding the wafer is attached to the turntable. A belt and pulley drive is used to rotate the turntable when it is necessary for the wafer alignment.

18 Claims, 44 Drawing Figures

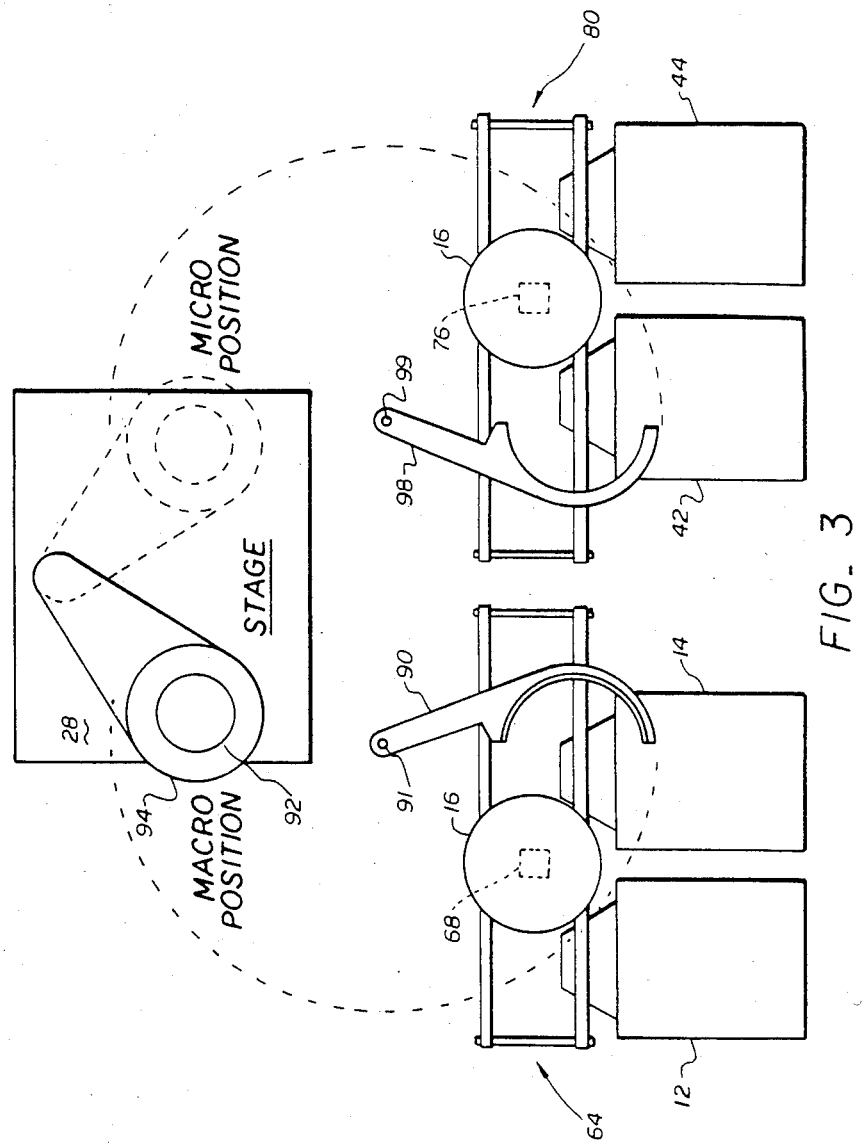

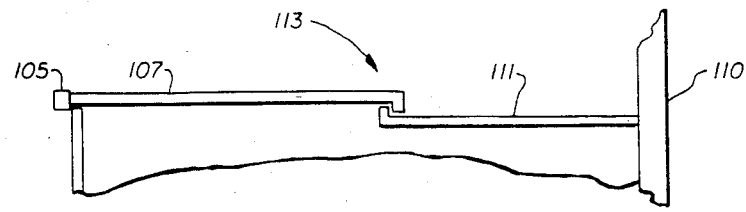
FIG_ 4a
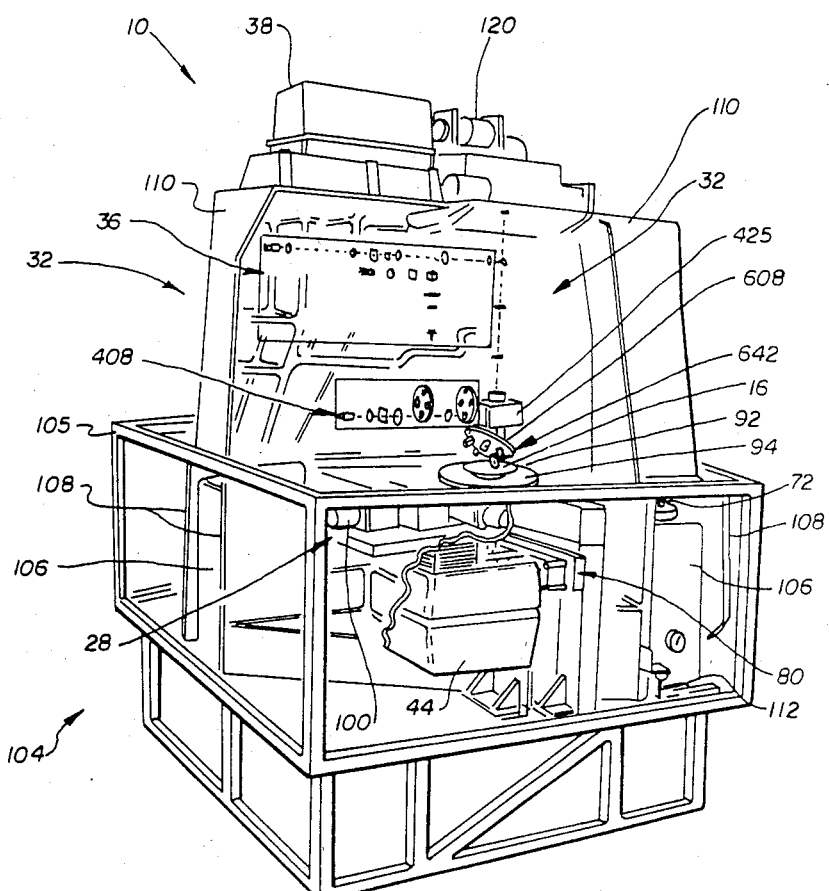
FIG_ 4

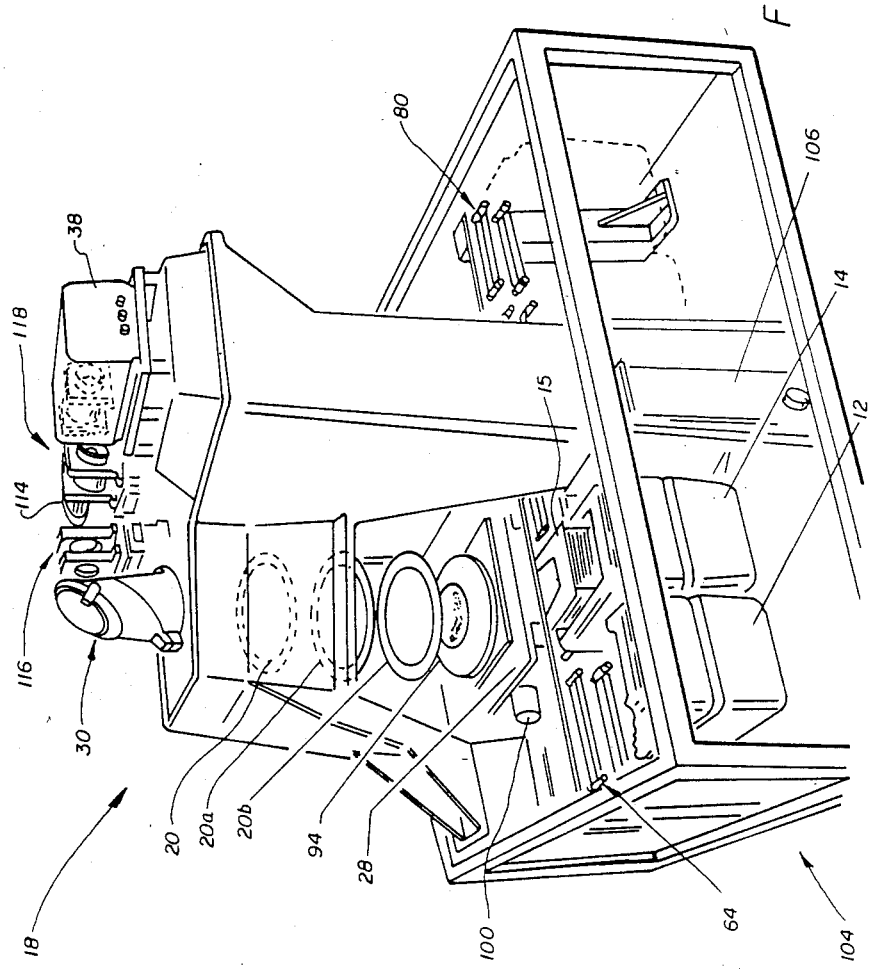

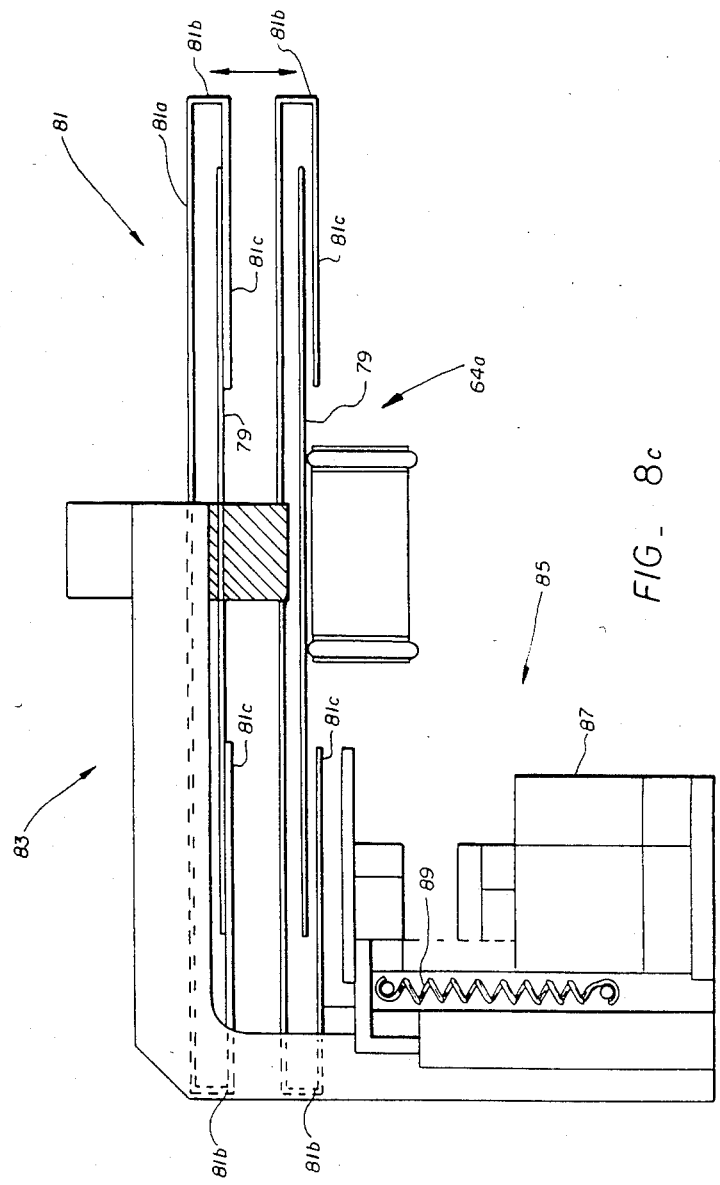

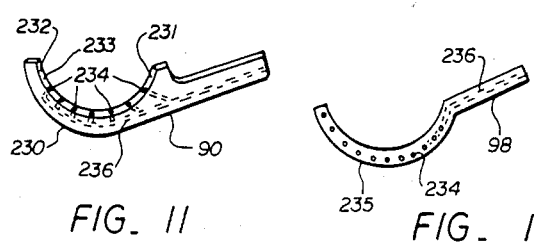
FIG_11  FIG_11a
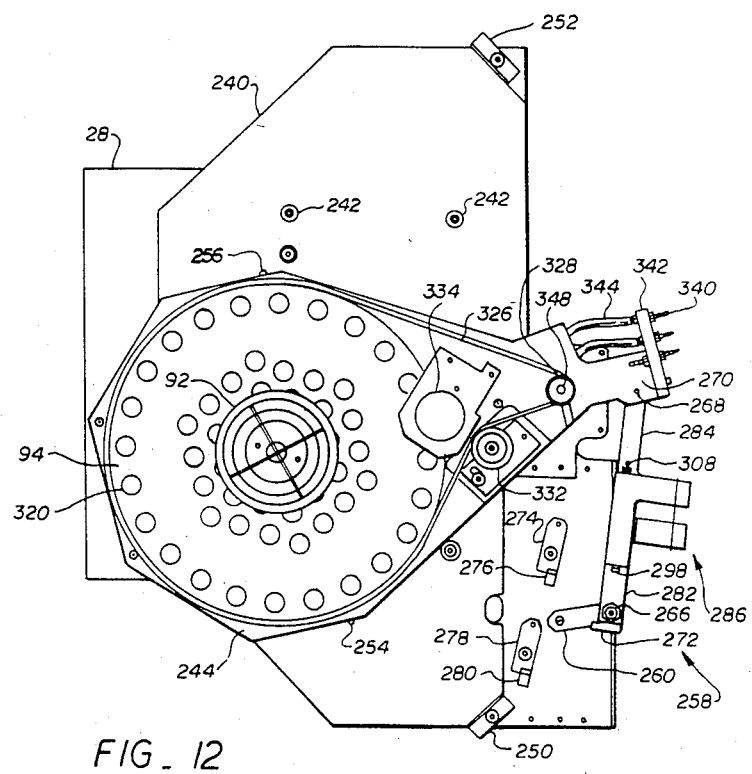
FIG_12

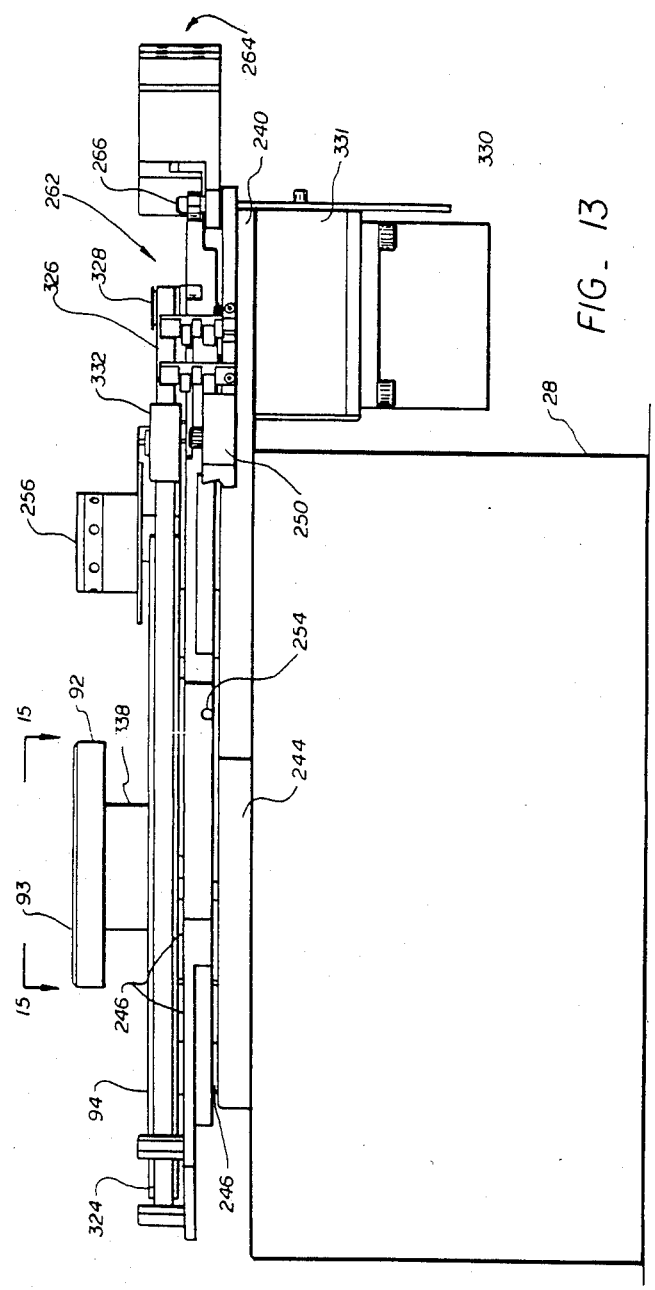

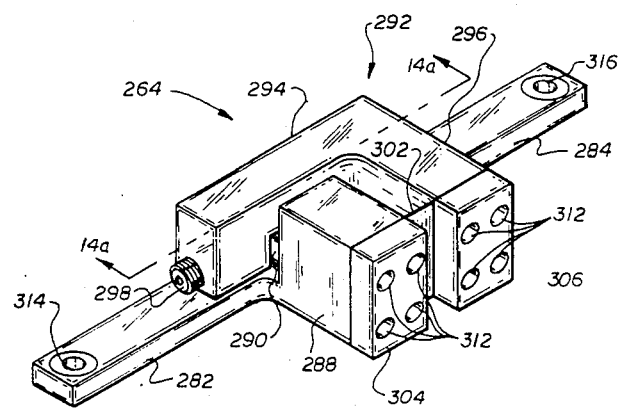
FIG_ 14
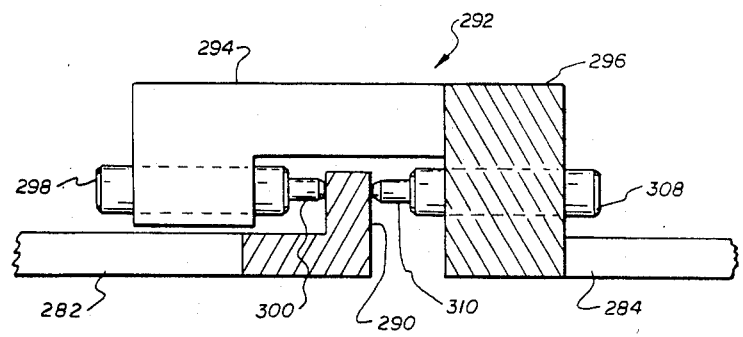
FIG_ 14A

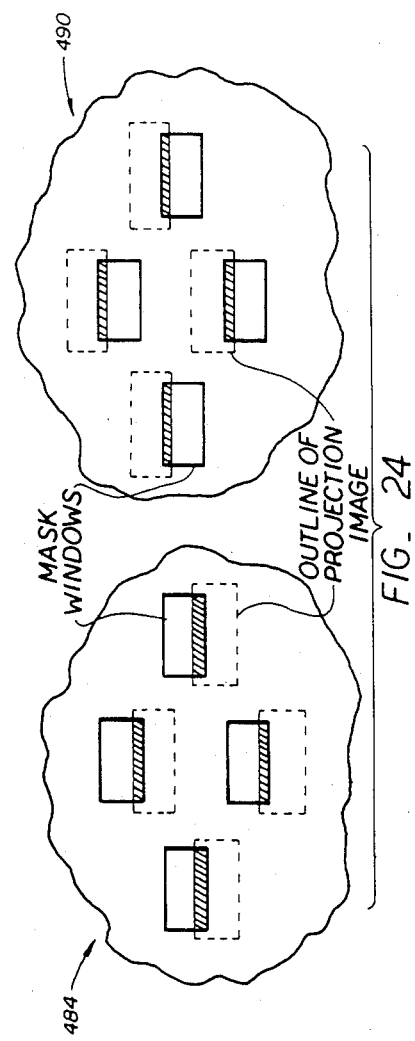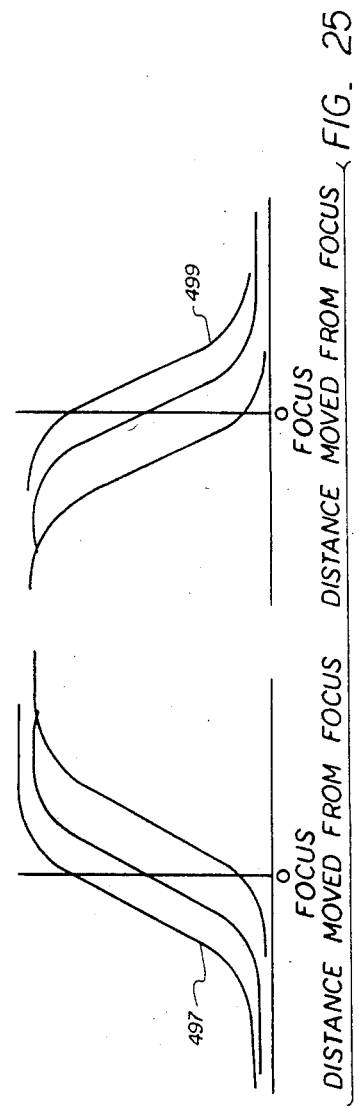

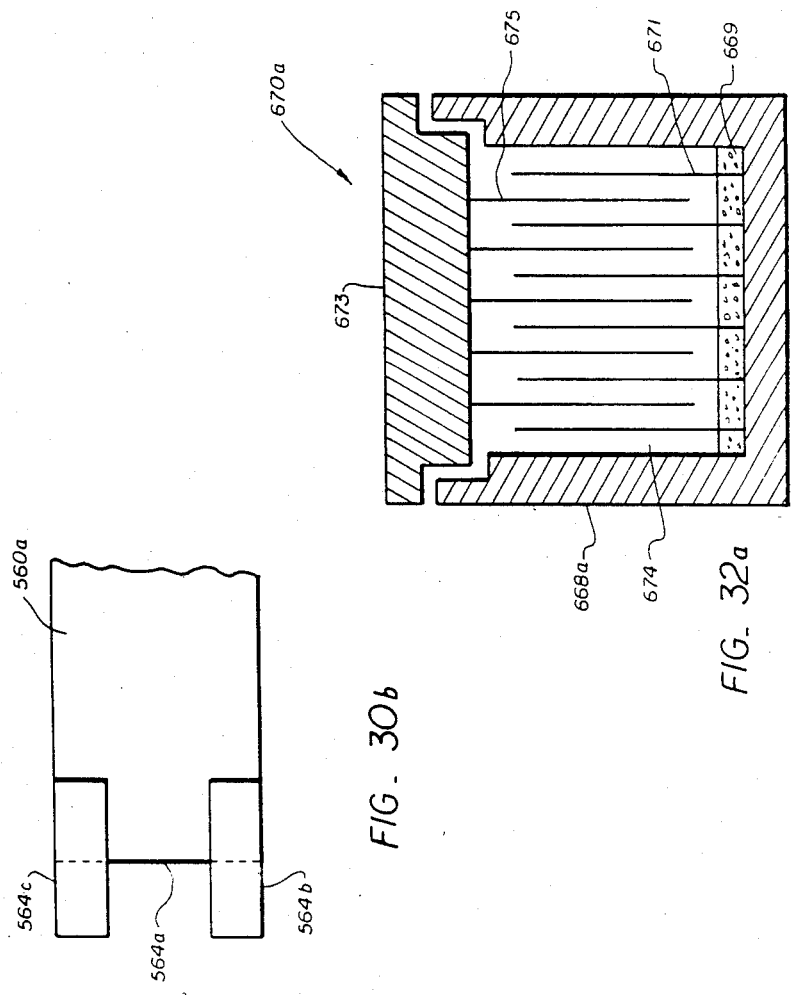

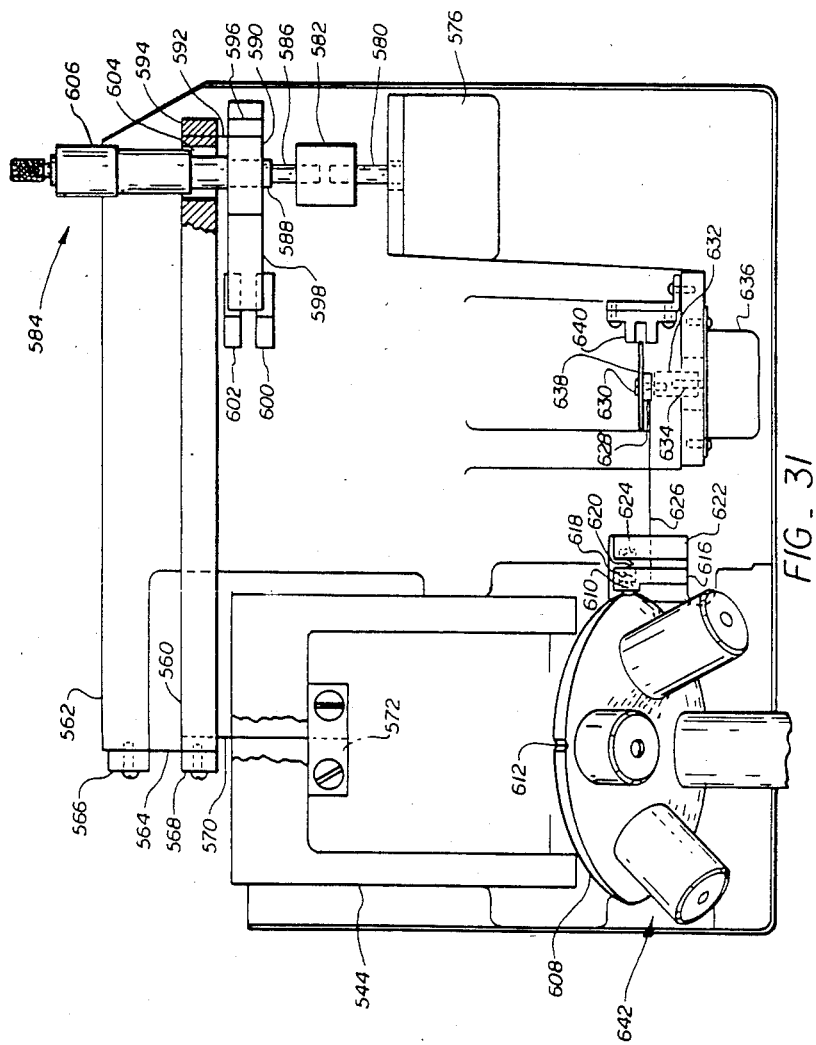

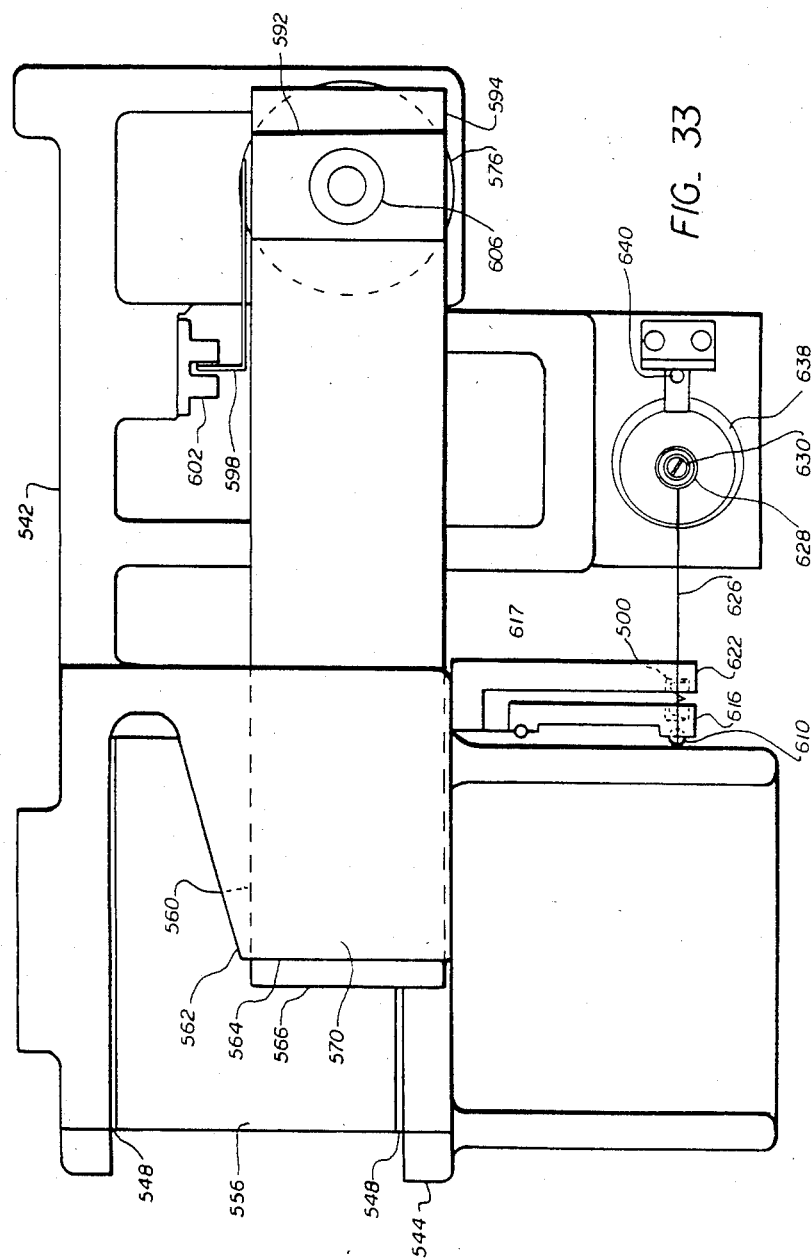

X-Y STAGE FOR A PATTERNED WAFER AUTOMATIC INSPECTION SYSTEM

BACKGROUND OF THE INVENTION

1. Field of the Invention

This invention relates to an X-Y stage for adjusting the position of a patterned wafer for macro and micro optical inspection and, more particularly, to a mechanism for accurately shifting the wafer from the macro optical axis to the micro optical axis at which the respective inspections are to occur.

2. Description of the Prior Art

It is well known to use a crossed roller type stage to move a patterned wafer in two orthogonal axes during manual operator micro inspection of a wafer. Where two optical systems are to be incorporated in one wafer inspector, it is necessary to move the wafer from one station to the other. In addition, a similar increment of travel is still required at each station. While such movement could be accomodated by the crossed roller technique alone, stage size would be increased by the need to move the distance between two optical systems, in addition to the movement required at each station separately. This invention discloses a technique for using a small stage, capable of only moving the distance required at one station, on which is mounted an arm and a chuck which can be moved a precise fixed distance. The distance in this case being equal to the distance between optical systems. This technique is less expensive, smaller in size and faster in operation than a single stage capable of the entire range of movement.

SUMMARY OF THE PRESENT INVENTION

It is an object of this invention to use a crossed roller type X-Y stage for precise positioning of a wafer under two inspection stations known as the macro and micro inspection stations.

It is another object of this invention to use a transport arm which pivots about a vertical axis to move the wafer from the macro inspection station to the micro inspection station on said X-Y stage.

It is yet another object of the invention to support said transport arm above said X-Y stage by air bearings during transport.

It is a further object of this invention to use a spring-loaded mechanism to drive said transport arm against hard stops in the macro and micro station locations so as to correctly position the arm each time it is moved from one station to the other.

Briefly, the invention comprises an X-Y stage with macro and micro inspection stations adjacent opposed sides of said stage, transport means for shifting a patterned wafer from one inspection station to the other for inspection of said wafer, said transport means including means for holding said wafer in position and means for rotating said wafer.

IN THE DRAWING

FIG. 3 is a block diagram which symbolically illustrates the automatic handling of a wafer as it passes through micro and macro inspections in accordance with a preferred embodiment of this invention;

FIG. 4 is a partially broken, front perspective view of wafer inspector (10) in accordance with this invention illustrating the rigid stress frame (104) and portions of the heavy aluminum castings (108) and (110);

FIG. 4A is a broken elevation view illustrating the air lock at the junction between fixed and floating environmental covers.

FIG. 5 is a partially broken left front perspective view of wafer inspector (10) which illustrates the macro inspection station (18), input wafer cassette loaders (12) and (14), input wafer track (64), X-Y stage (28), turntable (94), and macro optics;

FIG. 8C is an elevation view of the garage (81) and associated components used with alignment wafer (79);

FIG. 11 is a partially broken top view of the distal end of wafer transfer arm (90) illustrating the the recess (232) in wafer holding member (230) and the vacuum holes (234) in the recess;

FIG. 11A is a partially broken top view of the arcuate part of wafer transfer arm (98).

FIG. 12 is a top view of the X-Y stage (28) and shows the turntable (94), vacuum chuck (92), and the flipper drive assembly (258);

FIG. 13 is an elevation view of the X-Y stage (28), turntable (94), vacuum chuck (92) and the flipper drive assembly (258) shown in FIG. 12;

FIG. 14 is an isometric view of spring-loaded drive link (264);

FIG. 14A is a partially broken section view along the line 14A—14A of FIG. 14;

FIG. 16 is an elevation view illustrating the drive mechanism for the macro lenses, moveable mirror and pentaprism;

FIG. 19A illustrates darkfield control element (426);

FIG. 19B shows the partialy silvered mirror (428);

Figure 23:
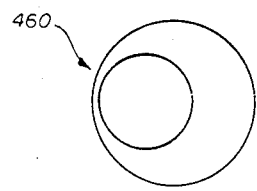
Figure 26:
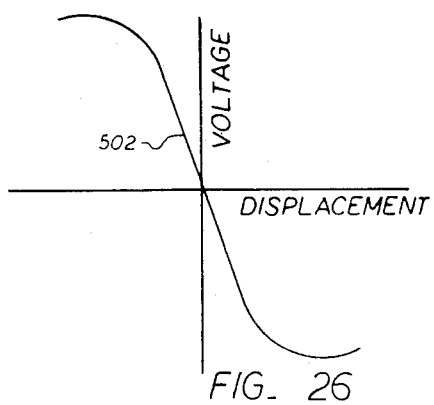
Figure 27:
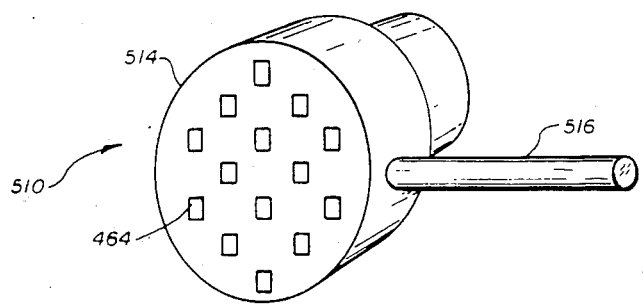
Figure 28:
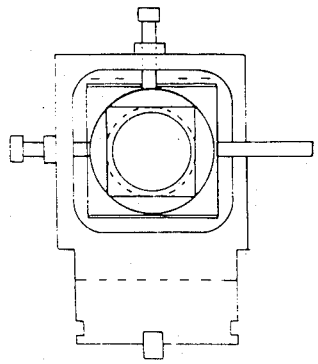
Figure 29:
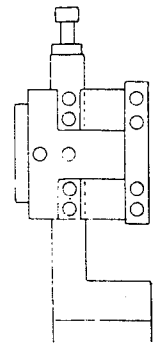
Figure 30:
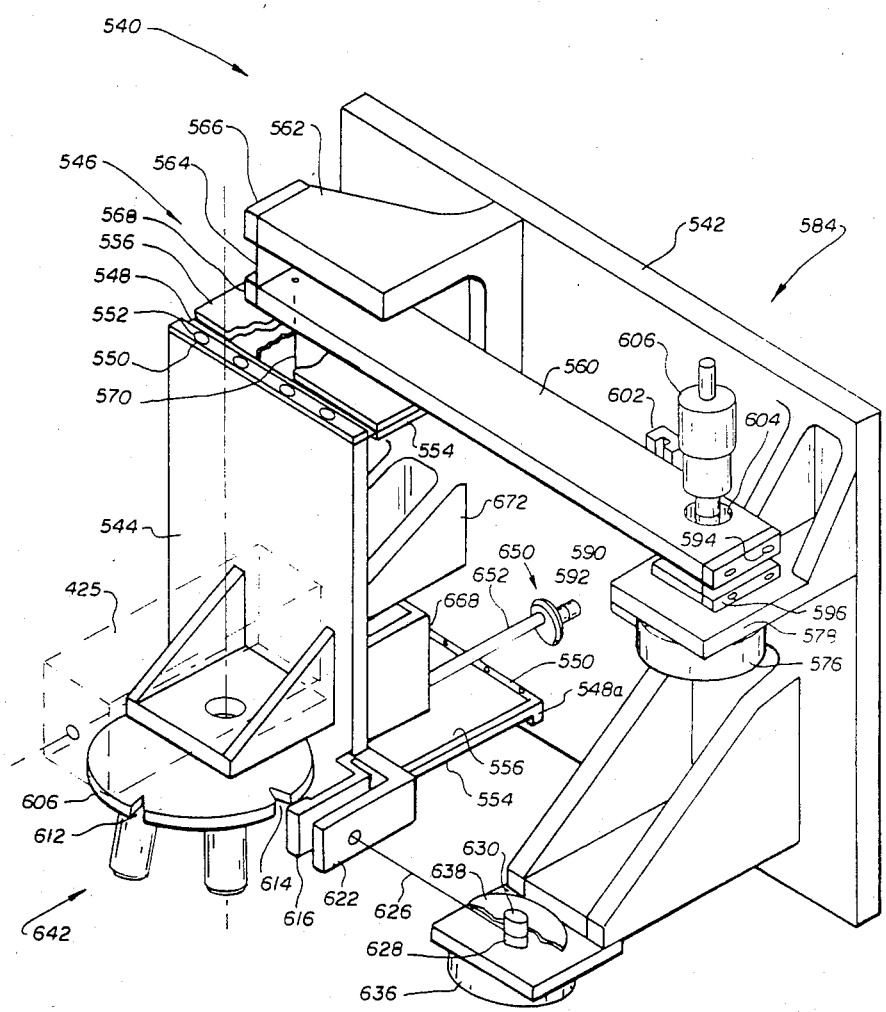
Figure 30A:
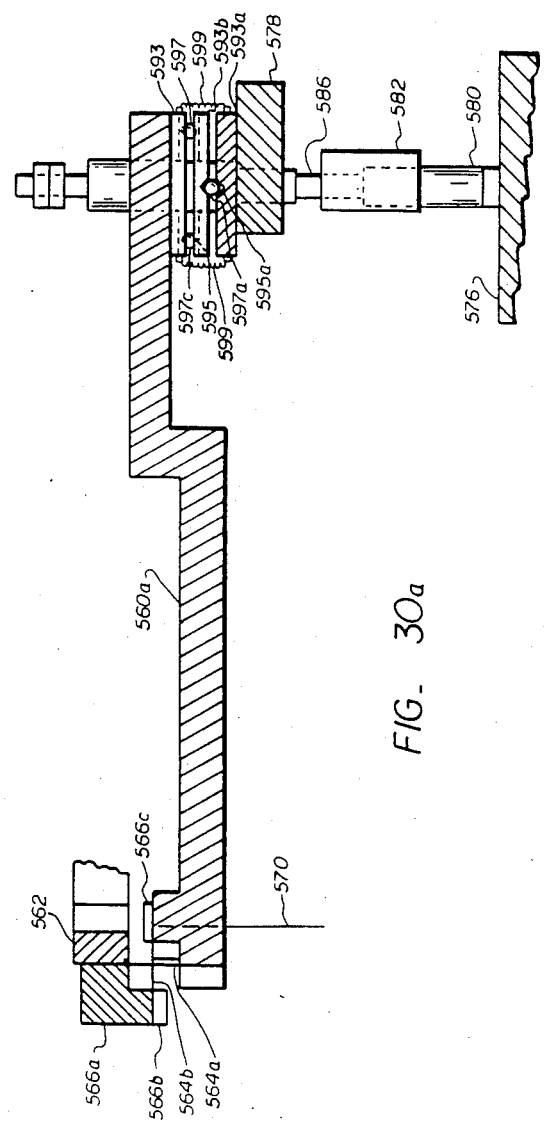
Figure 32:
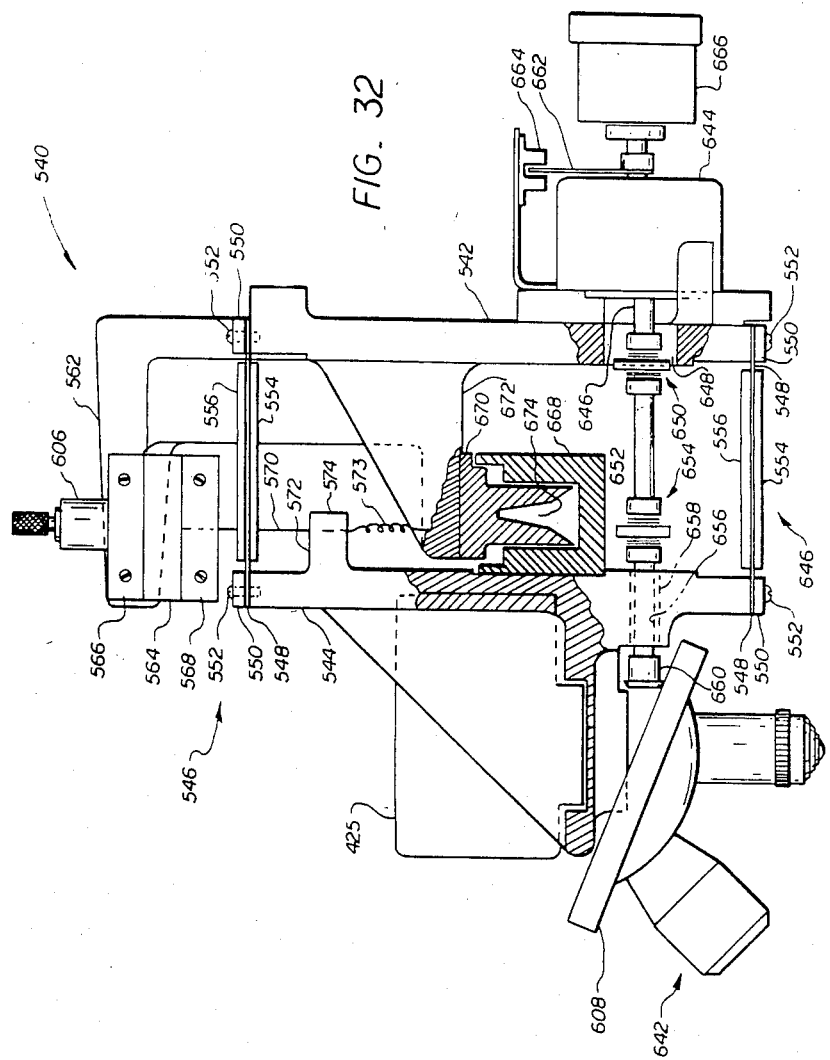

FIG. 23 symbolically illustrates the location of the image of the autofocus pupil stop within the back aperture of microscope objective;

FIG. 24 is a broken view which illustrates the masks and projected image for autofocus control;

FIG. 25 shows graphs of the photodetector output currents which would result from different occlusions of each of the masks shown in FIG. 24;

FIG. 26 is a graph of the control voltage obtained by subtracting the output of photodetector (494) from the output of photodetector (488);

FIG. 27 is an isometric view of an adjustable optical module including a reticle pattern;

FIG. 28 is an elevation view of a mount used to permit X, Y, Z and theta adjustment of the lens optical module of FIG. 27;

FIG. 29 is a side view of the mount shown in FIG. 28;

FIG. 30 is an isometric view of a preferred embodiment of the turret mounting assembly of the present invention;

FIG. 30A is a side view of the position control lever arm (560A) used in a preferred embodiment of this invention;

FIG. 30B is a top view of that portion of lever arm (560A) which further illustrates the crossed flexures employed;

FIG. 31 is a front view of the turret mounting assembly of FIG. 30;

FIG. 32 is a side view of the turret mounting assembly of FIG. 30 and illustrates the well (668) and damper (670);

FIG. 32A shows a preferred embodiment of a damper assembly (670A) used in the instant invention; and FIG. 33 is a top view of the turret mounting assembly of FIG. 30;

DETAILED DESCRIPTION OF THE PREFERRED EMBODIMENT

System Description

Figure 1:
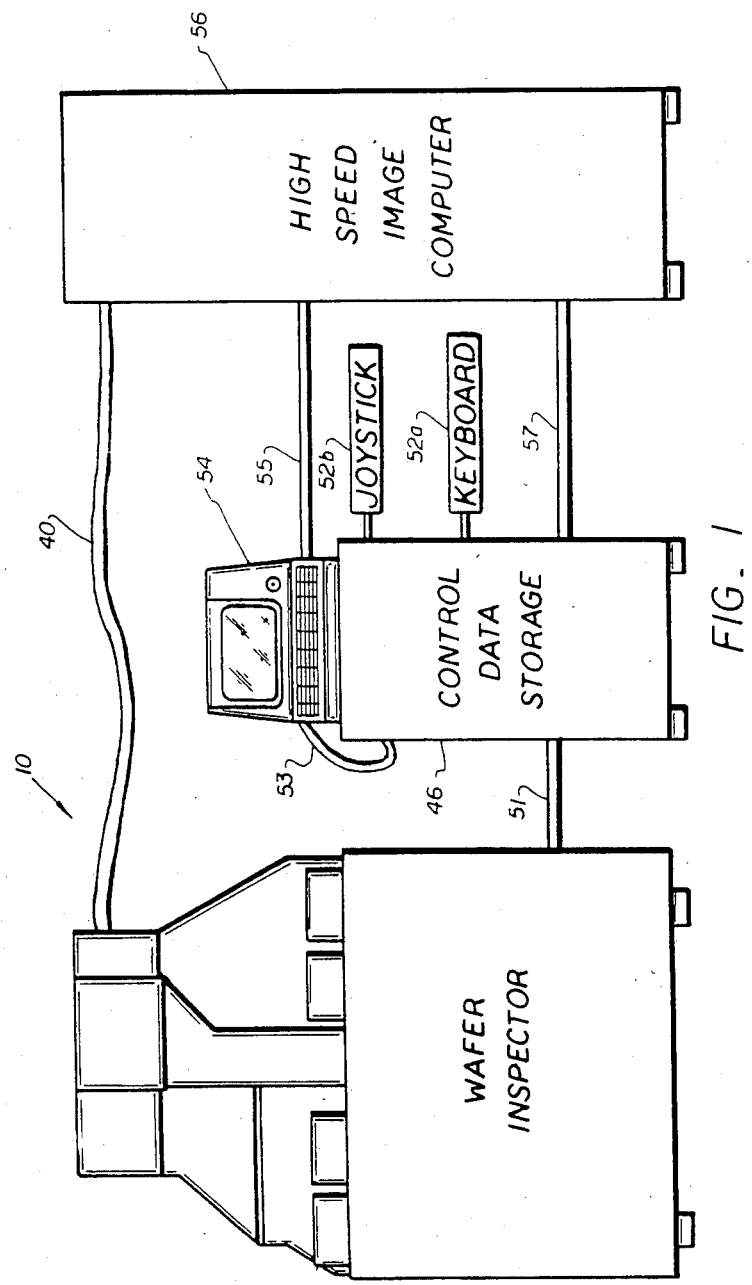
FIG. 1 is a block diagram illustrating the main elements of a wafer inspection system in accordance with a preferred embodiment of this invention.
Figure 2:
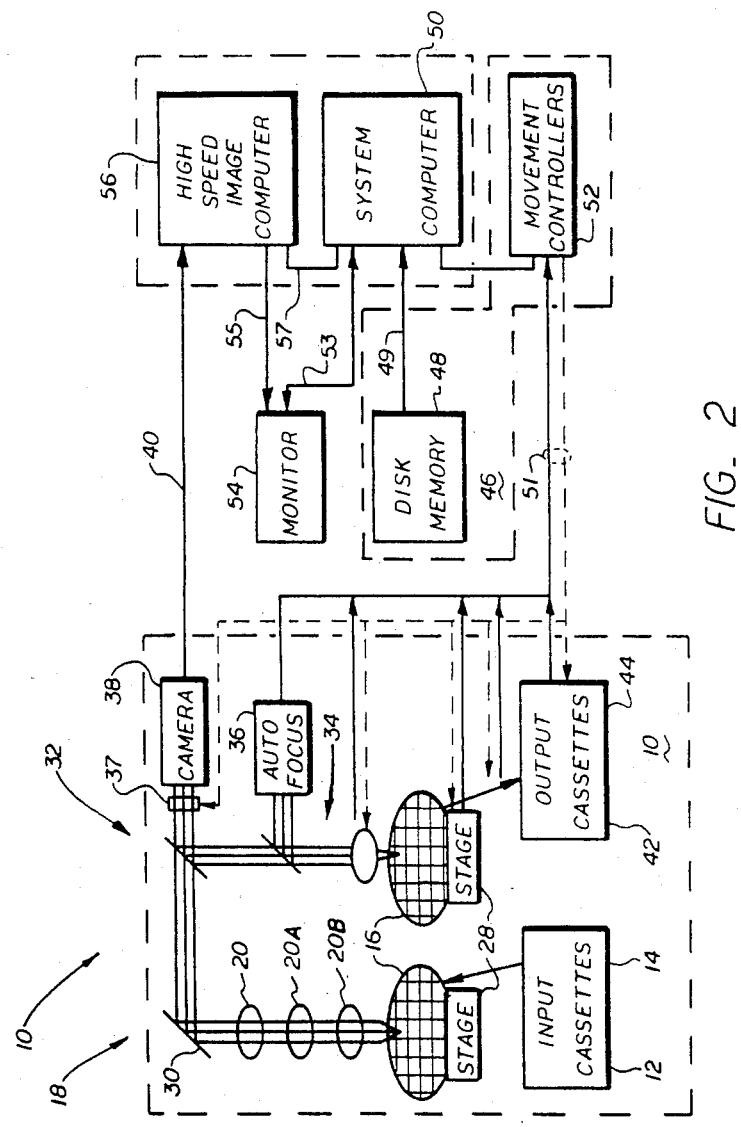
FIG. 2 is a block diagram which generally illustrates the functions performed by the wafer inspector system of this invention.
Figure 6:
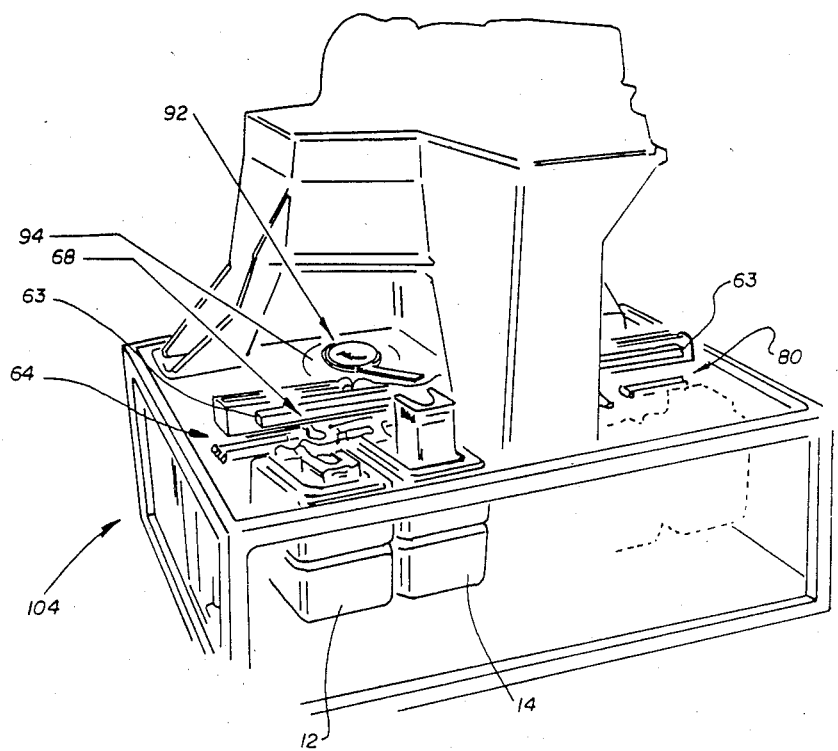
FIG. 6 is a partially broken view of wafer inspector (10) illustrating the input load pad (68) and input wafer arm (90) that are used in moving the wafer from the wafer track (64) to the wafer vacuum chuck (92)
Figure 7:
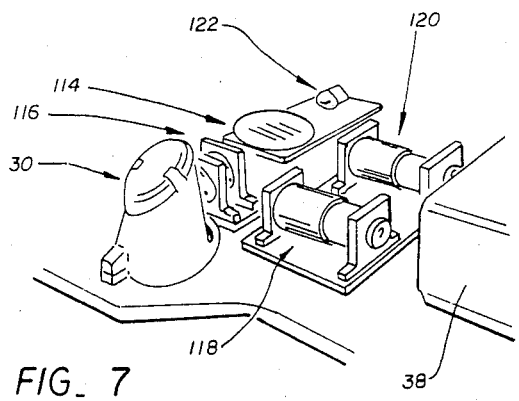
FIG. 7 is a partially broken view of the upper part of wafer inspector (10) which illustrates in more detail the macro optics and the interchangeability of the moveable macro mirror (114) and the pentaprism (122)

Referring now to FIGS. 1 and 2, it may be seen that the wafer inspection system in accordance with this invention comprises three major sub-systems; the wafer inspector 10, the control and data storage 46 and the high speed image computer 56. Electrical interconnection paths are shown and are designated as 40, 49, 51, 53, 55 and 57. A monitor 54 may also be employed. The general functional inter-relationship among the sub-systems comprising the wafer inspection system may be understood by reference to FIG. 2; and the manner in which the wafer is transported from the load pad 68 to vacuum wafer chuck 92 and thence to unload pad 76 is generally illustrated in FIG. 3.

The system program is designed such that interaction with the system will be through a touch screen on monitor 54, an associated joystick 52B and by use of a concealable keyboard 52A. The monitor will display text and graphics from system computer 50 via path 53 as well as wafer pattern images from high-speed image computer 56. The use of joystick 52B is for manual movement of the wafer and for graphics. The system computer program is menu driven and, during routine wafer inspection, tests to be performed are initiated by touching the appropriate "buttons" on the touch screen on monitor 54. The keyboard 52A is also accessible but is for use by the test designer. An entry code is required before parts of the program to be used in an inspection, for a particular class of wafer, may be selected. The procedure allows the designer to change the inspection and parameters of the micro tests. Interactive "menus" will appear on the terminal requesting the necessary input to either create an inspection, to inspect wafer(s), or to obtain data output. The part of the program which the operator routinely sees is designed such that the routine inspection of production wafers can be done with just a few instructions given to the system via the touch panel on the monitor.

Overall control of the system is provided by the system computer 50 which, among other things, insures that the various step sequences and inspection tests are performed in an orderly manner. The various sequences move a wafer 16 from a cassette such as 12 to and through the macro and micro inspection stations and finally outputs the wafer into a cassette such as 42. Each event in the sequence is accomplished in its sequence at the programmed time. However, it should be understood that a number of non-conflicting sequences are performed simultaneously to reduce inspection time to a minimum. The wafers move to and away from the inspection area simultaneously. During inspection, the system is performing the following three major functions in parallel:

(1) moving the wafer into position and focusing on and grabbing the image;

(2) loading the test data from disk storage into RAM; and (3) performing the computation required for the test. Micro inspection includes a micro-measurement and a micro-comparison. The test location is found by the use of a location image which was previously chosen manually during training and is stored in the inspection as a fundamental part of the micro-test. Micro-measurement is performed on preselected geometries. Any field can be compared (micro-comparison) to a reference image, or to the similar field in another die on the same wafer. One source for the reference image is a previously inspected die on a good wafer. The data base which was used to produce the image directly or indirectly by optical or electron beam means can then be used as a reference image. Disk memory 48 can also be programmed to provide a standard reference image from the composite of several die for comparison with the image obtained from the wafer during micro inspection, thus removing random defects from the reference image by comparison.

There are four cassettes 12, 14, 42 and 44 that are shown. The cassettes are standard types and are placed in indexers whch permit the transfer of a wafer to the wafer track from the cassette and/or to the cassette from the wafer track. Any of these four cassettes can be configured as an input or output. For purposes of discussion, cassettes 12 and 14, hereinafter, will be considered to be input cassettes and 42 and 44 will be considered as output cassettes. During operation, however, a host input cassette which is empty is used as an output cassette. This is done to accommodate overflow as it is not expected that the number of wafers that pass and fail will be equal in number. These cassettes can be configured to accommodate industrial standard cassette sizes and stepping distances. Wafer sizes of approximately 75 millimeters (3 inch) to 150 millimeters (approximately 6 inch) can be accommodated.

Referring now to FIGS. 2 and 3, it may be seen that a wafer from one of the input cassettes 12 or 14 is positioned in accordance with a control signal along path 51 from movement controller 52. At the proper time, the control signal will cause the wafer to be loaded onto wafer track 64. The wafer track 64 moves the wafer 16 to the load pad 68 which is located between the two input cassettes. As will be explained in detail subsequently, load pad 68 is then caused to move vertically upward so as to position the wafer above the track 64. Next wafer transfer arm 90 is moved across and beneath load pad 68 so as to be positioned on the other side of the wafer as shown. This places the recessed portion of the arcuate end of the arm in position to accept the wafer. The load pad is next moved downward to an intermediate position so that the wafer is slightly above the shelf which is at the bottom of said recess in the transform arm 90. The wafer is now in position to intersect the recessed side wall. The transfer arm is then swung to a position adjacent the load pad. Because the wafer is not precisely positioned on the load pad the side wall of said recess gently and correctly moves the wafer so as to place the wafer in position above the shelf. Next the load pad is lowered to its original position and is now out of the path of the transfer arm. A vacuum is then drawn via the vacuum holes in the shelf at the bottom of said recess to hold the wafer thereto for transport. It is to be noted that no gripping of the wafer edges is necessary. The wafer transfer arm 90 then moves the wafer 16 above the X-Y stage 28 and the wafer is placed on the top surface of a vacuum chuck 92 that is attached to turntable 94. The turntable is in the macro inspection station.

Prior to inspection the wafer edge and flat are found, the wafer having been loaded onto the chuck in a random orientation and alignment. The images picked up in macro view are first used to correct rotation and positioning of the wafer pattern. The wafer surface is then tested for pattern defects such as for bad spin, scratches, dust, etc., as well as gross image defect variations due to areas being out of focus or not receiving uniform exposure. Light for the macro inspection process is supplied by ring lamps 20, 20A and 20B, and the fixed macro mirror 30 transmits the reflected image to the camera 38. Camera 38 converts the image into electrical signals which are passed along path 40 to high speed image computer 56 and the image appears on the screen of monitor 54.

Once the macro inspection is completed, movement controller 52 causes the macro-micro transport arm (described below) to shift the assembly containing the vacuum chuck to the micro inspection station on the X-Y stage 28. The wafer 16 is held on the vacuum chuck 92 by pressure caused by a vacuum pulled on the bottom surface of the wafer. As will be explained in more detail later, this handoff between the macro and micro stages is precisely performed so that the wafer is positioned for the micro inspection test. Correction for mechanical positioning errors is under the control of the system computer.

Tests are typically carried out at a number of sites, each of which is positioned automatically by the machine. A stored series of images at each site are used to correlate the image picked up from each wafer under test. Thus, the mechanical stage is not required to position to high acuracy. Correlation is used to select that portion of an approximately positioned image which is to be tested. The machine may be programmed to go to a particular series of test sites and the tests which may be different at each site can also be specified. The system is designed to lead the user through tests by a series of menus and "buttons" on a touch activated screen. This makes the system self-teaching. The sites for tests are selected by the user; subsequent wafers to be tested are simply loaded in a cassette. The machine handles and aligns and tests the wafers and routes each of them to pass or fail cassettes as a result of the tests which are done entirely automatically. The sites selected for a test may or may not be unique. If the machine is to find a particular site again, it must use a series of unique references. These are automatically chosen by the program and do not necessarily have to be within the field of view.

Because of the use of objective lenses and the requirement to focus at a precise depth in the wafer pattern, each one of a plurality of objective lenses must be brought into focus prior to the time that the pixel image is recognized. As will be explained in more detail hereinafter, an autofocus unit shown as 36 in FIG. 2 automatically adjusts the focus of each of the objective lenses immediately after they are put into alignment with the optical axis. During stage movement, shutter 37 is closed so that no light reaches the tube face of camera 38 until the X-Y stage is steady and the objective focused. Then, the shutter is opened so that the image is presented to the input of the camera. The camera beam current is controlled to allow integration of the light received during the entire time the shutter is open. Once the shutter is closed, the signal is read from the camera. The stage can move in parallel with this operation. Next, the picture image is transmitted to the high speed image computer 56 where it is compared against a standard reference, or against an image reference which was obtained from the wafer itself and stored in temporary memory.

Once the micro inspection has been completed, a second wafer transfer arm 98 moves into a position adjacent vacuum chuck 92 and beneath wafer 16. The vacuum is removed from chuck 92, arm 98 then lifts up to position the wafer above chuck 92. A vacuum is pulled to hold the wafer on top of arm 98. Next, the arm 98 is caused to swing about a pivot point 99 so as to position wafer 16 above unload pad 76. Once in position, controller 52 actuates the unload pad assembly causing it to move vertically upward and lift the wafer 16 up above the arm 98. Then controller 52 causes the arm 98 to be swung so as to be free of the wafer downward path. Next, the unload pad 76 moves vertically downward to position the wafer 16 for transport on track 80. Because the computational analysis is carried on during the inspection process, the determination as to whether the wafer 16 is a "good" wafer or a "bad" wafer has already been made. The wafer 16 may be classified as "pass" or "fail" and the wafer directed to cassette 42 or 44, depending upon its classification. Movement controller 52 then activates that portion of track 80 that will move wafer 16 to the proper cassette.

Wafer Inspector

Referring now to FIGS. 4–11, in conjunction with the following discussion, the operational features of wafer inspector 10, in accordance with the present invention, may be comprehended. A welded stress frame 104 provides for rigid mounting of its base portion to a floor or other firm mounting surface. The rigid frame provides support for two heavy aluminum castings 108 and 110 which are specially constructed to maximize their damping constants. The base casting 108 sits on three air isolators 106 which rest on the welded stress frame. The upper casting 110 is firmly attached to the top surface of the base casting by means of bolts. (not shown). In this way, critical elements of the inspection stations are isolated from external movements.

Although not illustrated in detail, so as to not clutter the drawing, the welded stress frame provides mounting facilities for the wafer handling system. This isolates the moveable elements from the inspection. The stress frame also provides for the mounting of environmental covers, see FIG. 4A, which surround the area through which the wafer passes during inspection so as to provide environmental control. Environmental covers are also attached to the floating portion of the wafer inspector. In order to maintain isolation between the stress frame and floating inspection station, the environmental covers are not interconnected but lie in different planes, which overlap, and are formed to provide a channel adjacent the edge. One such arrangement is shown in FIG. 4A where a fixed cover 107 is attached to fixed member 105 of stress frame 104, and a floating cover 111 is attached to aluminum casting 110. This creates an air lock 113 between the two overlapping covers because the interior of the wafer inspector is maintained at a positive pressure. Air passing through the air lock under pressure prevents outside contaminants from entering the inspection area.

Wafer Transport

The wafers to be inspected are contained in input wafer cassette loaders 12 and 14 and these cassette loaders are positioned as shown adjacent the input wafer track 64. If a wafer is to be loaded onto the wafer chuck 92, the enabled loader outputs a wafer 16 onto an "O" ring belt track 64 where it moves to a position midway between the cassette loaders 12 and 14. While an "O" ring belt track has been shown, as a preferred way to move the wafer, it could be understood that other techniques may be used to provide the desired transport. For example, a walking beam may be used, or direct moving arms may be adapted to accept the wafer and transport it to the load pad. It is then raised up off the belt by a load pad 68, and the wafer transfer arm 90 swings underneath the wafer 16.

Figure 8:
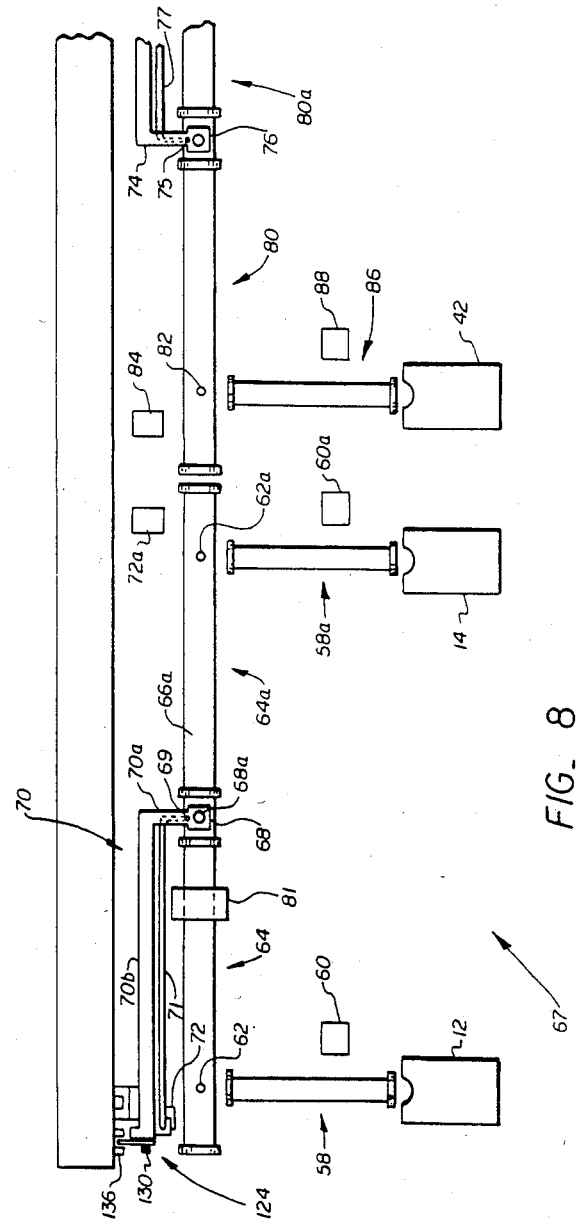
FIG. 8 is a partially broken top view of wafer loading assembly (67), load pad (68) and associated actuator assembly, and illustrates wafer tracks for delivering a wafer to load pad (68) and the vacuum line (71) which provides holding force for the wafer.
Figure 8A:
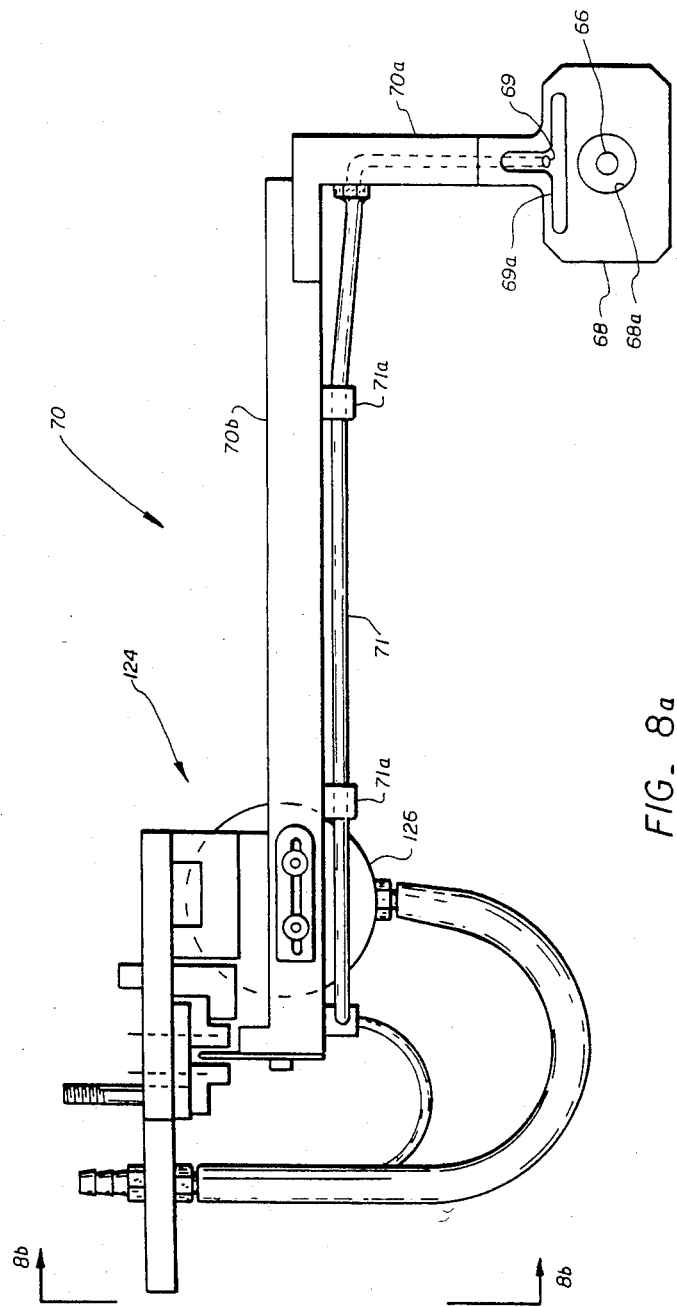
FIG. 8A is a top view of the load pad actuator assembly arm (70) and ball slide assembly (124)

The manner in which wafer transport is accomplished can be better understood by referring to FIGS. 8-11. Referring now to FIGS. 8 and 8A, a loading and unloading assembly 67 is shown which includes, for example, cassettes 12 and 14, "O" ring tracks and the load pad 68 attached to a vertical drive arm 70. A wafer to be loaded from cassette 12 is indexed onto "O" ring track 58 which is driven by motor 60. An optical transmitter 62 positioned between and below the upper track 64 sends its optical signal vertically upward to an optical receiver mounted in optical rail 63 (see FIG. 6). Interruption of the light signal by the wafer 16 stops motor 60 and activates motor 72 which drives track 64 so as to carry the wafer toward load pad 68. An optical transmitter 66 is positioned below the load pad aperture 68A and the light signal is transmitted through the aperture 68A to an optical receiver in the rail 63. Interruption of the light signal from transmitter 66 notes the presence of the wafer on the load pad 68 and other programming information is used to determine what is to happen next. For example, if only selected wafers are to be subjected to the inspection, the wafer can be passed on along the track to be deposited in one of the other cassettes. If the wafer is to be subject to inspection, the wafer is stopped on the load pad 68, which is formed as a part of drive arm 70.

Figure 8B:
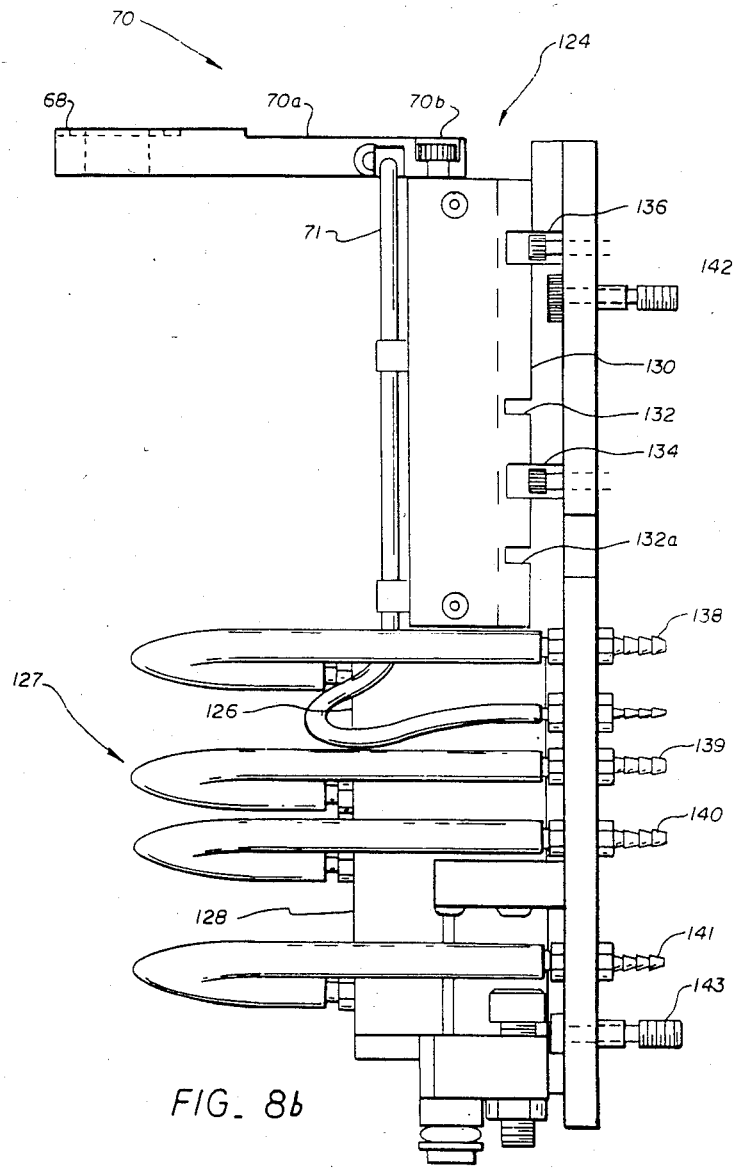
FIG. 8B is a view along line 8B—8B of FIG. 8A.

The structure of the drive arm and the ball slide and air piston drive arrangement are shown in more detail in FIGS. 8A and 8B. The drive arm 70 is L shaped with load pad 68 attached to the end of the transverse member 70A. A vacuum line 71 is attached to the edge of the longitudinal member 70B by mounting clamps 71A in a well known manner. The vacuum line 71 passes into the transverse member 70A adjacent the juncture of the transverse and longitudinal members. The vacuum line 71 runs within the transverse member to recess 69 in "T" shaped cut out 69A. Thus, a vacuum can be pulled which is used to hold the wafer 16 on load pad 68 during vertical movement thereof.

The drive arm 70 is held in a horizontally aligned position by an actuator assembly comprising a ball slide assembly 124, which is driven vertically up and down by a pair of air pistons 126 and 128. Air piston 126 has air feed lines attached in a well known manner to air lines (not shown) via couplings 138 and 139 and air piston 128 has air feed lines attached to couplings 140 and 141. As air feed lines and air supply sources are well known they are not shown to avoid drawing clutter. The manner in which the air pistons operate is described in more detail hereinbelow. Once a wafer has been selected for inspection its movement along the wafer track is stopped when the wafer is positioned immediately above load pad 68 by the interruption of the light signal through aperture 68A. The movement controller 52 stops the wafer track with the wafer centered 10-30 miles above load pad 68. A suction is applied to aperture 69 via vacuum line 71. Then air pressure is applied to the air pistons to drive the ball slide arrangement 124 upward. As it rises and the upper surface of the load pad comes in contact with bottom of the wafer, the vacuum force becomes effective to hold the wafer securely on the load pad during movement thereof. The amount of upward displacement is controlled by a flag 130 and, in particular, cut outs 132 and 132A, which operate in conjunction with optical detectors 134 and 136, to repeatably set the displacement. It is to be noted that the drive arm 70 and, of course, its associated load pad may rest in any one of three positions: (1) slightly below the wafer track; (2) above the transfer arm (maximum upward displacement); and (b) at an intermediate position. Initially the drive arm is raised to its top position by the application of air pressure to air pistons 126 and 128. Next, the wafer transfer arm 90 is swung under the drive arm 70 and is positioned on the other side of the wafer. Then the drive arm 70 is lowered to its intermediate position which positions the wafer slightly above the recess 232 in the wafer transfer arm 90. As could be expected the wafer setting on load pad 68 is not aligned so as to fit comfortably in recess 232 without some adjustment. For this reason a sidewall 231 is included on wafer transfer arm 90 to align the wafer as said arm is maneuvered into a position adjacent load pad 68. Thus, it is seen that the drive arm assembly provides a controlled vertical motion upward from a rest position to a predetermined height above the "O" ring track and a motion downward from said predetermined height to a position slightly above the recess 232 in arm 90 and also to a position slightly below the "O" ring track so as to be in position to readily accept a wafer from the track.

The diameter of load pad 68 is smaller than the wafer so that when the wafer transfer arm 90 swings adjacent the wafer, after the load pad is lowered to its intermediate position, the wafer is aligned in the recess 232 without interference from load pad 68. Finally, the load pad can pass through the aperture in the wafer transfer arm 90 as the load pad 68 moves downward. Thus the wafer is transferred to the wafer transfer arm for transport.

In order to ensure that the wafer inspector 10 is properly aligned and ready to perform inspection test 5 tests, a calibration wafer 79 is first run through the inspections. The calibration wafer is stored in garage 81 as shown in FIG. 8C. Garage 81 includes a top 81A, downwardly extending sidewalls 81B and partial floor elements 81C extending inwardly from the lower end of each of the sidewalls. When not in use, the calibration wafer 79 is stored in the garage which is then positioned above the wafer track 64A. When the calibration wafer is to be used, air piston 87 of actuator assembly 85 is disabled and coil spring 89 acts to drive the garage 81 downward to its lowest position. The vertical movement is maintained by guide assembly 83. As may be seen in FIG. 8C, the wafer 79 is deposited on the wafer track 64A and the partial floor elements 81C are below the top surface of the O-ring belts of track 64A. The track is enabled to move the wafer toward load pad 68 from which it will be passed through the wafer inspector as the calibration is checked and adjustment made as necessary. Once back to the O-ring track the calibration wafer is directed to a position within the garage. The air piston 87 is then enabled which raises the garage and wafer above the track so that normal wafer inspections may be effected.

As has been previously noted, it is possible to program the computer so that any one of the cassettes may be used as the input or output, and, of course, the output cassettes can be designed as pass and fail. Further, the inspection can be limited to specifically designated wafers in each cassette. If a wafer is not selected for test, it will be moved past load pad 68 and along track 64A to track 80. If cassette 42 is designated to accept uninspected wafers, optical signals from optical transmitter be interrupted. This detects the presence of the wafer and causes the drive motor 84 to stop. The wafer is then positioned adjacent "O" ring track 86 and motor 88 will then be activated to carry the wafer to cassette 42. Conversely, when wafer 16 has been inspected, wafer transfer arm 98 will move the wafer from the vacuum chuck 92 to a position above unload pad 76. As described for load pad 68, unload pad 76 will be activated to rise vertically and lift the wafer 16 from the transfer arm 98. The vacuum in the arm having been removed so that the wafer readily moved upward with the motion of the unload pad. A vacuum is applied to recess 75 of unload pad 76 via line 77 to hold the wafer on the uload pad 76 during downward motion.

The transfer arm 98 is then moved away and the unload pad actuator arm 74 moves vertically downward. The wafer can then be moved to the left or right on track 80 or 80A, respectively, and the direction of motion will depend upon the results of the inspection and the location of the pass and fail cassettes. Only a part of the track 80A is shown. Further, not any part of cassette 44 and its associated "O" ring track have been shown. It should be understood, however, that operation of these elements will be similar to that described for cassette 42 and its associated optical detectors and "O" ring tracks. Consider the wafer to have passed inspection and is to be lodged in cassette 42. The presence of the wafer 16 on unload pad 76 is recognized by the interuption of the light signal from optical transmitter 78, which is centered below the aperture 76A. The associated optical receiver being located in rail 63 which is located above the O-ring track. Movement controller 52 will enable motor 84 so as to cause track 80 to move the wafer from unload pad 76 past optical transmitter 78 and over optical transmitter 82. This interupts the light signal. The position of the wafer is recognized by movement controller 52 which stops motor 84. Next, motor 88 will activate belt 86 to move wafer 16 into cassette 42.

Wafer Transfer Arm

Figure 9:
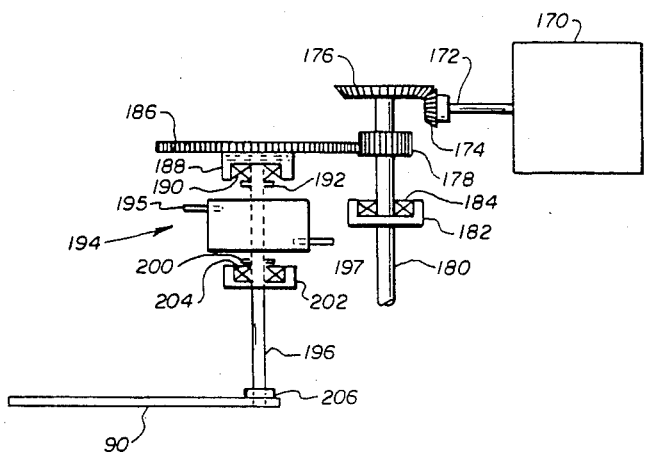
FIG. 9 is an elevation view of the drive assembly for the wafer load transfer arm (90)
Figure 10:
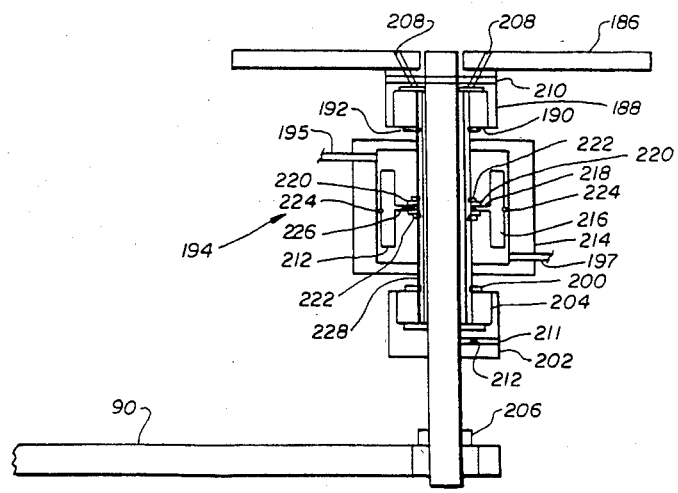
FIG. 10 is a sectioned elevation view of the air piston (194) and drive assembly for wafer transfer arm (90)
Figure 15:
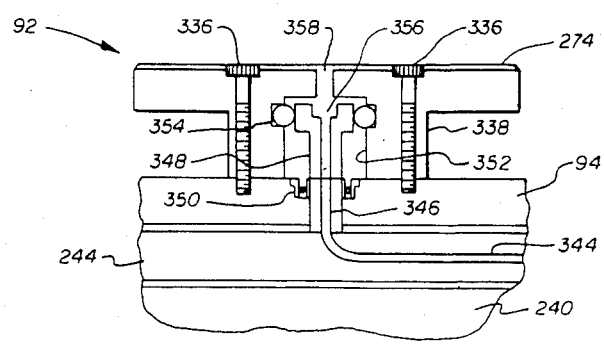
FIG. 15 is a section view of the vacuum chuck (92) and a broken view of turntable (94) and illustrates how the vacuum chuck is mounted and how a vacuum is applied to hold the wafer in place.

The manner in which the wafer transfer arms 90 or 98 are driven to move a wafer between the load pad 68 or unload pad 76 and the vacuum chuck 92 may be understood by reference to FIGS. 9–11. A stepper motor 170 has a shaft 172 connected to a bevel gear 174 which drives a bevel gear 176. A pinion gear 178 is attached to a vertical drive shaft 180 that rotates in bearing 184 that is held in bearing support block 182. The drive shaft 180 is attached to bevel gear 176, thus the motion of the stepper motor 170 causes pinion gear 178 to rotate. A spur gear 186 is driven by the pinion gear 178. It should be noted that the pinion gear 178 is considerably wider than the spur gear 186. Spur gear 186 is connected to an upper bearing support block 188 by pins 208. These pin the gear to the hub. Pin 210 is used to pin the hub to the wafer arm drive shaft 196. A lower bearing support block 202 has a threaded aperture 211 in which a set screw 212 is threaded to lock it to the shaft. Ball bearings in the upper and lower bearing support blocks are designated 190 and 204, respectively, and snap rings 192 and 200 hold the ball bearings in position in the upper and lower support blocks.

Intermediate the upper and lower bearings is an air piston 194 which has an air cylinder housing 214 that encloses an air cylinder piston 216 that includes a piston drive connector 218. The snap rings 222 below and above the piston drive connector 218 lock the air cylinder piston 216 to the air cylinder shaft 228. O rings 224 and 226 minimize leakage around the cylinder 216. Air may be applied via ports 195 or 197 depending upon whether the wafer arm is to be driven down or up, respectively.

Thus, it is seen that the use of the wide pinion gear 178 allows a controlled vertical movement of the wafer transfer arm 90, for example, while still allowing for drive motion, when the arm is in either the upper or lower vertical position. As will become clear in the subsequent discussion, the transfer arm is driven at its lower vertical height to pass under the load pad prior to accepting the wafer. In order to position the wafer 16 on wafer vacuum check 92, the transfer arm 90 moves laterally at its highest vertical position. Once the transfer arm is positioned above the chuck, the transfer arm is dropped vertically downward to transfer the wafer 16 to vacuum chuck 92. The transfer arm 90 is then moved out of the macro inspection area.

To pick up a wafer from load pad 68, the load pad is raised to position the wafer at its highest level and to place the load actuator arm 70 above the path of transfer arm 90. The wafer arm 90 swings underneath the raised load pad 68. The load pad is dropped down to the intermediate position which positions the wafer 16 a few millimeter above shelf 233 in recess 232. Transfer arm 90 is then moved to a location adjacent the load pad and the side wall 231 of recess 232 gently moves the wafer so that it is correctly positioned on the shelf 233 of recess 232. The vacuum on load pad 68 is released and the load pad is dropped down to its original position. This motion causes the wafer to be deposited in the arcuate recess of arm 90. The arcuate position is designed to accept the particular size wafer being inspected and as noted hereinabove, the arcuate position includes a recess 232 that provides a shelf 233 on which the bottom edge of the wafer 16 may rest. Note that there is no gripping action caused by the wafer holding member 230. The recess is sufficient to insure that the edge of the wafer is not forced against the side wall of the recess and the shelf extends radially inward far enough to provide adequate support. In addition to the force of gravity, which tends to hold the wafer in position, a series of vacuum holes 234 are provided in the shelf and these interconnect with vacuum line 236 by which a vacuum pressure is drawn to hold the wafer in position during transport.

Next, the wafer arm 90 is driven by stepper motor 170 until the wafer is positioned over the wafer chuck 92 which at this time is centered in the macro position. Air pressure is than applied via air inlet 195 of air cylinder 214 causing the wafer arm to move vertically downward and deposit wafer 16 on the wafer vacuum chuck 92. It being understood that the vacuum pressure holding the wafer 16 in the recess 232 of wafer arm 90 is released so as to avoid any undue pressure on the wafer 16 when the underside of the wafer encounters th flat upper surface of the chuck 92. The stepper motor 170 than drives the wafer arm into a neutral position between the X-Y stage assembly 28 and the input load pad 68.

In removing a wafer 16 from the micro inspection station, the wafer transport arm 98 is used. The drive motor moves the arm in its lowermost position to a position adjacent the vacuum chuck 92 and beneath the wafer 16. The chuck holding vacuum is released. The arm moves up and a vacuum is drawn through the vacuum holes 234 in the top of the arcuate position 235. It is to be noted that a recessed position is not required for the arm 98, and therefore the wafer rides on the top surface being held in place by vacuum.

Vacuum Chuck

The wafer vacuum chuck 92 is a cylindrically shaped member having a flat end wall 93 and is positioned on the X-Y stage 28 so as to centrally locate the wafer when the stage is in either the macro or the micro inspection station position. The diameter of the flat end wall 93 of chuck 92 is smaller than the wafer diameter and is small enough to allow the passage of either the wafer holding members 230 or 235 when the wafer is being deposited on or removed from the top surface of the vacuum chuck 92. An example of a size comparison is a 10 centimeter wafer which will be held by a 7.5 centimeter chuck. The chuck flatness, relative to the plane which is perpendicular to the optical axis, is 25 microns. The wafer is held to the chuck by a vacuum. As explained hereinabove, the wafer arm motion causes the holding member 230 to deposit the wafer 16 centrally on the chuck 92. The vacuum on the wafer arm 90 is released and the arm is retracted. Next, a vacuum is pulled on the chuck 92 to hold the wafer in fixed position thereon. The chuck 92 is releasably attached to turntable 94 so that different size chucks may be used to accommodate different size wafers.

X-Y Stage

Referring now to FIGS. 12-15, the manner in which the wafer 16 is positioned for inspection in either the macro or micro optical stations may be understood. The X-Y stage 28 is a crossed roller type stage which is well known. The X-Y stage 28 provides 7 inches of travel in each of two orthogonal axes. The stage is designed to provide sufficient motion to view the entire surface of a 6 inch diameter wafer with the travel centered on either the macro or the micro optical axis. Because these axes are 10 inches apart, a macro-micro transport arm 244 was developed to move the wafer 16 between the optical axes in a minimum of space.

Macro-Micro Transport Arm

The assembly comprises a base plate 240 which is mounted to the top surface of the X-Y stage 28 by means of mounting screws 242. A macro-micro transport arm 244 is supported above the base plate 240 by air bearings 246. The transport arm 244 is arranged to pivot around pivot 248 which is concentric with the central axis of a belt drive motor 330.

In FIG. 12, the macro-micro transport arm 244 is seen to be substantially centrally located with respect to the right side stop 250 and the left side stop 252 each of which are securely fastened to the base plate 240. These are hard stops and fixed, hardened ball-shaped bumpers 254 and 256 are positioned on transport arm 244 so as to engage, respectively, stops 250 and 252, depending upon the optical axis to which the mechanisn is driven. The transport arm 244 is preloaded against these hard stops which are provided at each end of its travel. The transport arm 244 is moved over its travel range by a motor driven crank arm 260 connected to it by a spring-loaded link 264, with the crank and link forming a straight line at each end of the travel.

The macro-micro transport arm 244 is driven by a flipper type mechanism 258 which consists of crank 260 that is driven at one end thereof by a double-reduction belt drive contained in housing 261. The double-reduction belt drive is, in turn, driven by stepper motor 330. The other end of the crank arm 260 is connected by means of an eccentric pin 266 to leg 288 of spring-loaded drive link 264. The other leg 284 of the spring-loaded drive link is pivotally attached by pin 268 to the macro-micro transport arm 244 by means of an extension member 270 (drive arm) which is directly attached to the transport arm 244. Thus, the turning of stepper motor 330 causes the crank arm 260 to rotate, and by means of spring-loaded drive link 264, the macro-micro transport arm 244 is pivoted about pivot 248. Once stepper motor 330 is enabled it will continue to move drink link 264 and, thus, transport arm 244 until sensor flag 272, which is attached to the proximal end of the drive leg 282, intersects a limit sensor, either 276 or 280, depending upon the direction of travel. Limit sensors 276 and 280 are positioned so as to be adjacent limit stops 274 and 278, respectively. These limit stops provide a back-up to insure that the drive mechanism does not attempt to drive the transport arm past the stops 250 or 252 attached to the base plate 240. At the same time, the spring-loaded drive link 264 is designed to insure that the transport arm 244 is forceably held against either stop 250 or stop 252.

The transport arm 244 must be moved so that it is always positioned and spring loaded against one of the hard stops. This is done to obtain a repeatable preload of the transport arm 244 against either stop 250 or stop 252. In order to accomplish such a result, it is necessary that the drive motor 330 drives crank arm 260 from one limit stop to the other. To obtain the desired result, a special drive link has been developed, and the drive link is shown in FIGS. 14 and 14A.

FIG. 14 is an isometric view of the spring-loaded drive link 264 and FIG. 14A is a sectional view illustrating the manner in which the mechanical interconnection is provided so as to permit the shortening of the drive arm link while maintaining a constant pressure against the transport arm to hold it hard up against a stop. It should also be noted that the structure is such that the links 282 and 284 are maintained in axial alignment at all times.

Referring now to FIGS. 14 and 14A, it may be seen that link 282 has a spring-stop 290 at the distal end thereof. Formed at the distal end adjacent to the the spring stop 290 is a flexure mounting block 288 which is at right angles to the axial length of leg 282. Leg 284 has an "L" shaped block 292 which includes axially aligned leg 294 and flexure aligned leg 296, the latter being parallel to the block 288. As may be seen in FIG. 14A, axial leg 294 has a cut out which provides space for the spring-stop 290 and movement thereof between the spring contacts 300 and 310 of the Vlier spring plungers 298 and 308, respectively. To prevent excessive axial misalignment of the legs 282 and 284, a flexure member 302 is attached to the end of blocks 288 and 296 by means of flexure retaining blocks 304 and 306, respectively, which are secured by mounting screws 312. An aperture 314 in the proximal end of leg 282 is adapted to accept eccentric pin 266, and the aperture 316 at the proximal end of leg 284 is adapted to accept pivot pin 268. Thus, the spring-loaded drive link 264 is connected between the crank drive arm 260 and the drive arm 270.

While the macro-micro transport arm 244 positions the wafer, which is located on the vacuum chuck 92, in either the macro or micro optical inspection station location, complete alignment of the wafer for inspection purposes may require the rotation of the wafer. For this reason, a turntable 94 is provided. The turntable 94 rests solidly on stage 28 during a test. Prior to rotary movement an air solenoid is operated and the macro-micro transport arm 244 is then supported on air bearings 246 to facilitate rotation. In order to minimize the weight of the stage assembly, a plurality of apertures are formed in the surface of turntable 94. One such aperture is shown as 320 in FIG. 12. The edge of the turntable 94 is crowned in order to keep the drive belt 326 centered on the edge of the turntable. A toothed belt drive pulley 328 is turned by a belt drive motor (not shown) and the pulley and belt drive motor axis of rotation are positioned at the pivot point of the macro-micro transport arm 244 and is identified as pivot 248. An idler pulley 332 is employed for adjustment of the belt drive tension.

While the use of a calibration or alignment wafer is the preferred method, a calibration target may also be used to initially align the inspector. A calibration target 334 is shown and is located on the transfer arm 244. The target is employed to effect precise camera and optics calibration prior to inspection. Because the position of the wafer is determined from the camera image before and after each move, the rotational repeatability of the stage need only be sufficient for a single rotation. Long term drift in repeated rotations is unimportant. Since a stepper motor is used for rotation, precise single moves may be made by moving a specified number of steps.

Vacuum chuck 92 is centered on turntable 94 and is securely attached thereto by means of mounting bolts 336 that pass through the top surface 93 of the vacuum chuck through the sides of the recessed cylindrical base 338 and are secured in the turntable 94. In order to supply vacuum to the chuck top surface, a vacuum line (not shown) is attached to chuck vacuum inlet connector 340 which is attached to the connector assembly 342 and is connected to the vacuum line 344 which passes between the transfer arm 244 and the turntable 94 and is connected to the vacuum feed line 346 located in stand pipe 348. Stand pipe 348 is connected to the transfer arm 244 and is not rotatable. Bearings 350 are provided in turntable 94, thus allowing rotation of the turntable as the stand pipe 348 remains stationary. The stand pipe 348 is a shoulder screw which passes through the central aperture 352 and turntable 94. The upper end of pipe 348 terminates below the inside of the top surface of the chuck recess 358. The bottom end of pipe 348 sits on the top surface of macro-micro transport arm 244. Vacuuum is drawn through the recess 348 and O ring 354, which is seated in recess 352, to provide the necessary sealing against the loss of a vacuum at port 358.

Macro Inspection

The wafer accepted from one of the input cassettes and transferred via wafer arm 90 to the vacuum chuck 92 is initially in the macro inspection station position. The wafer 16 is loaded onto chuck 92 without concern for orientation or precise alignment. Prior to the inspection, the wafer edge and flat are found. The images picked up in macro view are first used to efect correct rotation and positioning of the wafer pattern. The macro inspection employs three different angles of illumination as well as three different levels of magnification to inspect for topological and patterning defects. The full wafer is viewed initially (up to 150 mm in diameter). This requires the lowest magnification $1/16\times$ which gives the largest field of view. Also, the illumination is such as to give appropriate lighting to the full surface under test. The three angles of illumination are obtained by a vertical array of three ring lamps that are arranged to generate different angles of illumination, from near field to dark field. The range is approximately from 10 degrees to 85 degrees, with different lamps being used to highlight different types of wafer defect, i.e., topological or patterning defects. The lamps may be switched on and off under computer control. By viewing the wafer, the flat is first found and the wafer rotated to the approximately correct orientation. A second view of the pattern on the wafer is processed in the computer to determine pattern orthogonality (which may be displaced a few degrees from flat) and a more exact rotation of the wafer performed. A third view of the entire wafer is then used to align to a reference feature selected in X-Y by the user. The reference may be either a test die or the perimeter of a step array. Test areas can then be automatically positioned and inspected in the macro made. At the end of the macro tests, the computer chooses an area at the highest macro magnification, $\frac{1}{2}\times$, which is unique in its field of view and small enough to be found again in the largest micro objective field. It has to be unique within the area of uncertainty in positioning due to the sum of the errors in macro positioning and hand-off when seen in the micro field. It must be small enough so that it still resides completely within the micro field allowing for these errors.

The macro inspection requires the sequential use of the three different macro lenses, which means that each one must be separately moved into the optical path. The $\frac{1}{2}\times$ lens 116 is positioned to be directly in front of the macro mirror 30 when it is in use but is shifted out of the optical path when not in use. This is also true for macro lenses 118 and 120 although they are positioned adjacent the camera 38. The drive system must be precise and should take a minimum of space.

Macro Lense Transfer

Figure 17:
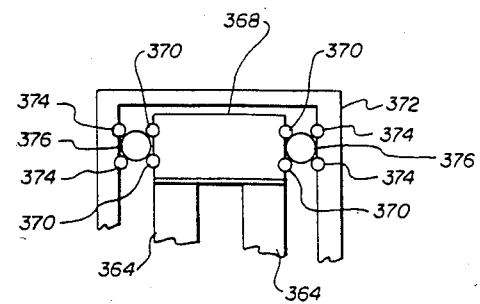
FIG. 17 is an end view along the line 17—17 of FIG. 16 illustrating how slider (372) is slideably attached to guide rail (368)

The preferred technique by which the macro lenses are moved is shown in FIGS. 16 and 17. Referring to the figures, it may be seen that a horizontal guide rail 368 is attached to vertical members 364 that are secured to the top surface of the upper aluminum casting 110 by screws 366. A slider 372 is secured to the top surface of the guide rail 368 by means of rods 370 and 374 which hold the balls 376 in position so as to provide an easy and accurate sliding motion. A drive arm 380 is pivotally attached to slider 372 via downwardly extending member 381 by means of a pivot pin 382. A wall 385 is formed in the space between the vertical members 364 and between the horizontal guide rail 368 and the top surface of casting 110. A stop member 388 is mounted on wall 385 and is positioned to intercept the stop screws 389 and 393 when the slider 372 is in either of its two assigned positions. Stop screws 389 and 393 are installed, respectively, in the lower ends of member 381 and 383. Adjustment is effected by lock nuts 391 and 395 which are adjusted so that the slider is stopped in the assigned position at each end of its travel. Note that drive arm 380 includes a flexible member 384 which includes expansion-compression sections 386 an 390 that allow slider 372 to be spring loaded against the stop in either direction of travel. In one direction the slider is driven until the screw is hard against stop 388. In the other direction, the slider is is driven until screw is against the other side of stop 388. It should be noted that there is a pad 372 that may contact the upper side of drive arm 380. Thus, the lens will always be accurately positioned, because the slider will be driven hard against the stop 388. The drive end of the drive arm 380 is connected to an eccentric arm 392 by means of pivot 394, and it is noted that the other end of eccentric arm 392 is pivotally attached at pivot 398 to spur gear 396 which engages with pinion gear 400 that is driven by stepper motor 402. The drive assembly for positioning a macro lens, the pentaprism or the moveable mirror is selected and is enabled by signals from controller 52. The sinusoidal motion of the crank provides gentle but accurate positioning at the stops while providing rapid movement in the center of travel. This is accomplished by each of the crank arm drive mechanisms.

In addition to the X-Y stage 28, on which the turntable 94 and chuck 92 are supported, the macro inspection station includes the wafer 16 and three ring lamps 20, 20A and 20B, which are selectively illuminated to provide the proper illumination for macro inspections. The reflected light passes upward toward a fixed macro mirror 30 where its direction is changed from vertical to horizontal and the light passes through one of the three macro lenses, 116, 118 or 120. Note that lens 116 which in the preferred embodiment is a $\frac{1}{2}\times$ lens is positioned so that it may be placed directly in front of the fixed macro mirror 30. Because the horizontal light direction from mirror 30 is at right angles to the input of camera 38, a moveable macro mirror 114 is positioned to intercept the light from macro mirror 30 so as to redirect it in the horizontal plane to the input of camera 38. In the path between the moveable macro mirror 114 and the camera 38, either the $\frac{1}{8}$ lens 118 or the 1/16× lens 120 may be inserted during the macro inspection process.

Following macro inspection, stepper motor 262 will be enabled by movement controller 52; and motor 262 will move crank arm 260, which, in turn, will move drive link 264 and cause the macro-micro transfer arm 244 to rotate about pivot 248. This moves the wafer from the macro inspection station to the micro inspection station and the X-Y stage will than be moved by drive motors 100 and 102 so as to repeatably position the wafer in the micro inspection station location. The system computer is programmed to provide for coarse adjustment of the wafer position during handoff. Fine adjustment is achieved by correlation of the images with reference images which were automatically selected as being unique in the macro and micro field of view. The same image at different magnifications is used. It should be noted that the turntable 94 is rotated as the X-Y stage 28 is "flipped" from the macro to the micro inspection station. This is done to correct for the rotation or the wafer due to the "flipping" movement and image rotation produced by macro and micro imaging systems. As noted hereinabove, image correlation is used to provide fine rotation adjustment and is accomplished by storing an image at one end of the wafer; moving over one die and finding the same image and correcting for misalignment. The stage is then moved a distance equal to an integral number of die near the other side of the wafer and final rotational adjustment is then made.

A number of the elements involved in the micro inspection are illustrated in FIGS. 4–7. At the time the wafer is being moved from the macro to the micro inspection station position, the moveable mirror 114 is moved out of the optical path and pentaprism 122 is moved into the optical path associated with the micro inspection station 32. The micro inspection system is built around a turret 608 and an imaging lens housing 425 of a Leitz Ergolux microscope. The turret 608 is placed on a special stepper motor driver mount which allows vertical motion of the turret to a resolution of $2\times10^{-6}$ inch to focus the microscope. A second stepper motor is used to automatically rotate the turret from one objective lens position to another with a handoff precision between objectives and with a repeatability of one micron. There are five objective lenses on the turret in the preferred embodiment. A discussion in detail of the vertical and rotational motion of the turret will be provided later.

Macro-Micro Optics

Figure 18:
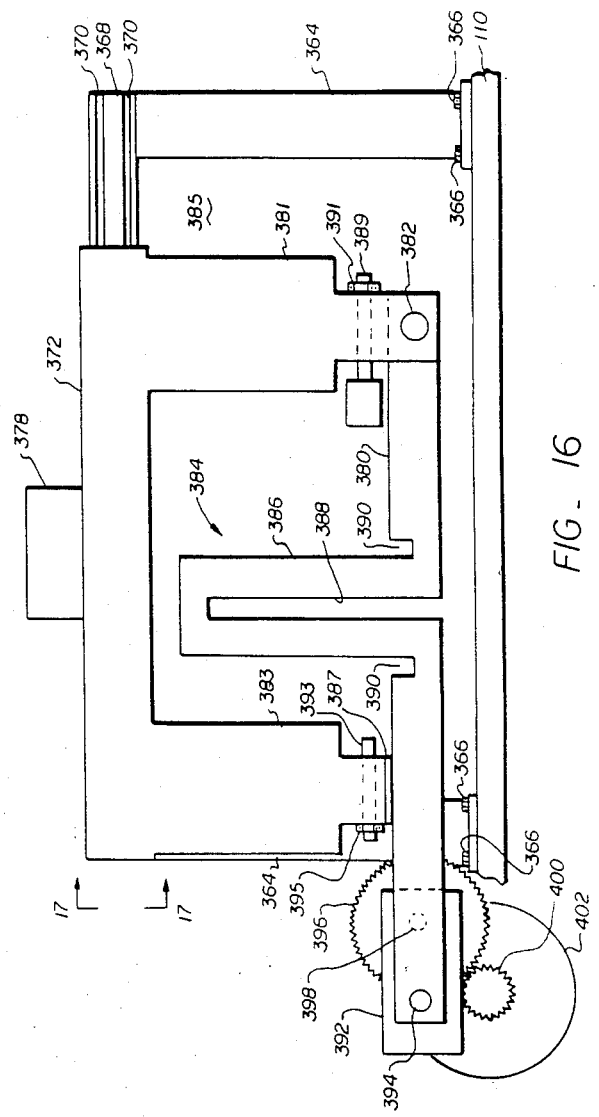
FIG. 18 is a schematic diagram which illustrates the basic optical elements and their interrelationships.

The overall optical arrangement for the macro and micro inspection stations is illustrated schematically in FIG. 18. For the macro inspection station 718, it may be seen that three ring lamps 20, 20A and 20B are vertically spaced one above the other, with each being symmetrically disposed concentrically about the macro optical path 19. The light shields 22, 24 and 26 are circular and positioned above each of the lamps to prevent direct light from the lamps being transmitted vertically upward. It is to be noted that the inwardly extending radial length of each shield increases for the higher positioned shields. The light from ring lamps 20, 20A and 20B illuminate the wafer under test 16 and the reflected light is transmitted to mirror 30 and is then directed to and passed through one of the macro lenses 116, 118 or 120, and moveable mirror 114. Note that mirror 114 appears in the path before either lens 118 or 120. A shutter 37 controls the light images that may be applied to the image input of the camera 38. When the macro-micro transfer arm 244 repositions the wafer 16 into the micro optical axis on X-Y stage 28, the moveable mirror 114 is moved out of the path and the pentapenta prism 122 is moved into position so that light from the micro optical path 470 is redirected via prism 122 to the image input of the camera 38. The images then are obtained using one of the five objective lenses 642 which are mounted on the lens turret assembly 608. Only one of the lenses is positioned so as to view the pattern on the wafer at one time and, as will be explained later, the camera 38 is not enabled to pick up the image prior to the time that the autofocus mechanism automatically insures that the image is in focus. The manner in which this is done will be discussed in more detail hereinafter.

Figure 19:
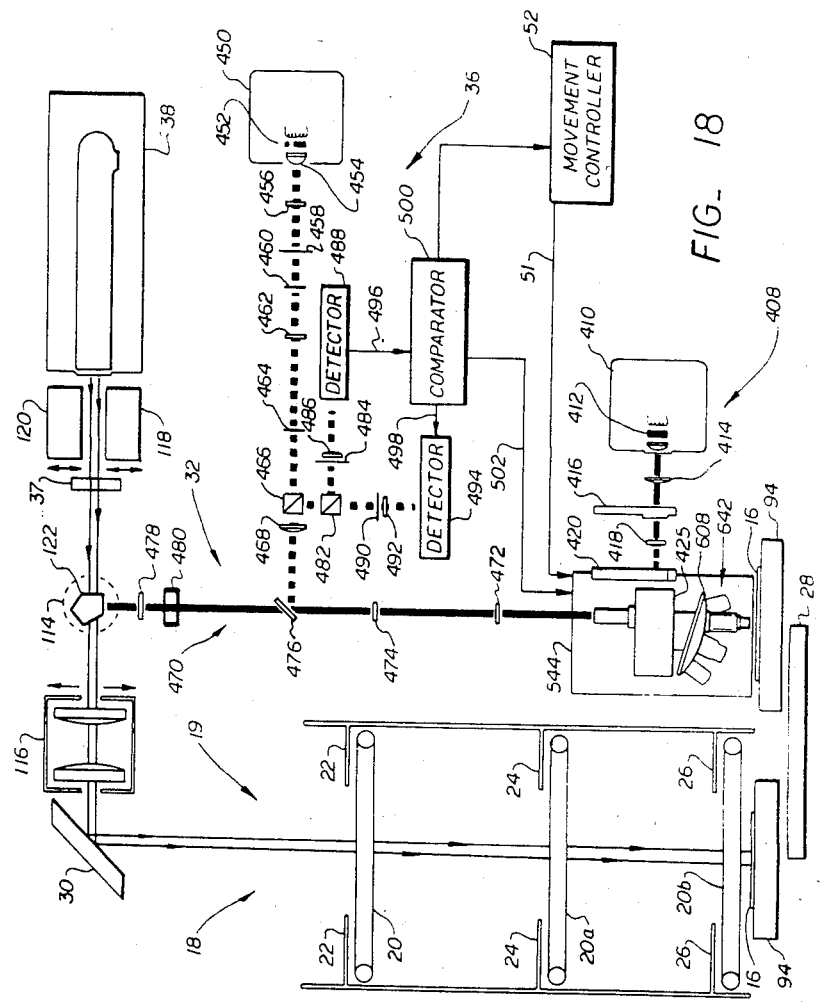
FIG. 19 is an elevation view of some of the micro optical elements and illustrates, in particular, the micro illuminator (408), imaging lens housing (425) and microscope objective lens (642)
Figure 21:
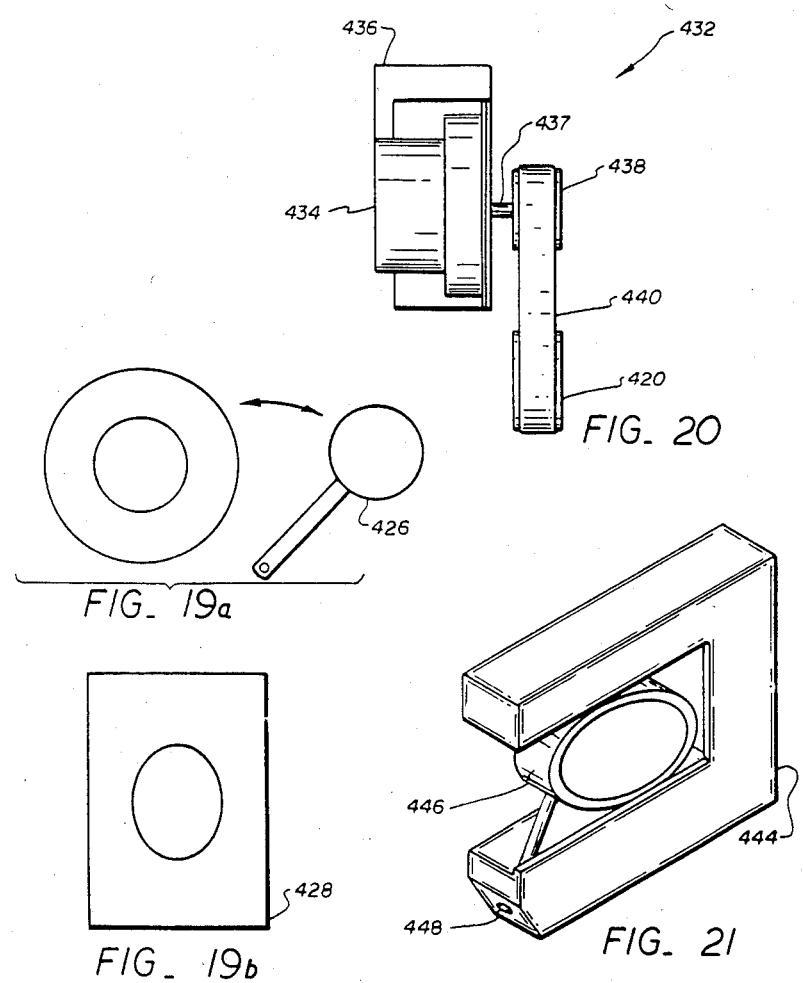
FIG. 21 is an isometric view of a lens bracket used in the micro illuminator (408)

In order to provide the appropriate illumination for the image system of the micro inspector, a main illuminator assembly 408 is provided as shown in FIGS. 18 and 19. In a preferred embodiment of the invention, illumination is provided by a modified light illuminator such as is standard on the Ergolux. Referring now to FIGS. 18 and 19, the illuminator assembly 408 for the micro inspection station includes an illuminator housing 410 which includes a lamp 412. The light from lamp 412 is passed through a central aperture to a frosted focusing lens 414. Next, the focused light passes through one light filter of a filter wheel 416 that is mechanically adjustable. A filter which passes light having wavelengths between 400 and 550 nanometers is used for most micro tests during an inspection. A narrow band filter is employed for line width measurements. A black and white camera is used principally because it has superior resolution as compared with a color camera. The filtered light then passes through a focusing lens 418 to an aperture and pupil stop assembly 420. The manner in which elements such as lenses 414 and 418 are held in position is illustrated in FIG. 21. Referring to FIG. 21 it is seen that a lens 446 is seated in lens holder 444 and is maintained in correct alignment by vlier screw 448.

As it is known, small apertures and narrow band light are needed to illuminate fields where maximum modulation or pattern definition is required, e.g., in line width measurements. Of course, this reduces the incident energy and thus increases the time required to obtain an image with an acceptable signal to noise ratio. Where such a critical measurement is not being made, the incident energy of the light can be greater and the image pickup time reduced. It is also necessary to change the illumination aperture for darkfield measurements.

The light from focusing lens 418 passes through pupil aperture 422 and fixed field stop 424 to the imaging lens assembly 425. The light is first controlled by a dark field control element 426 which may be adjusted to provide darkfield or brightfield illumination (see FIG. 19A). The bright or dark field light then passes through the annular lens 426 and then strikes the illuminator mirror 428. The partially silvered illuminator mirror 428 (see FIG. 19B) is positioned to reflect the light downward through the objective lens to the surface of the wafer and allows the reflected image to pass up through the micro optical path 470.

The elements in the micro optical path 470 are mounted in the optical rail 430, partially shown in FIG. 19. The optical rail 430 is mounted to the floating aluminum chassis 110.

Figure 20:
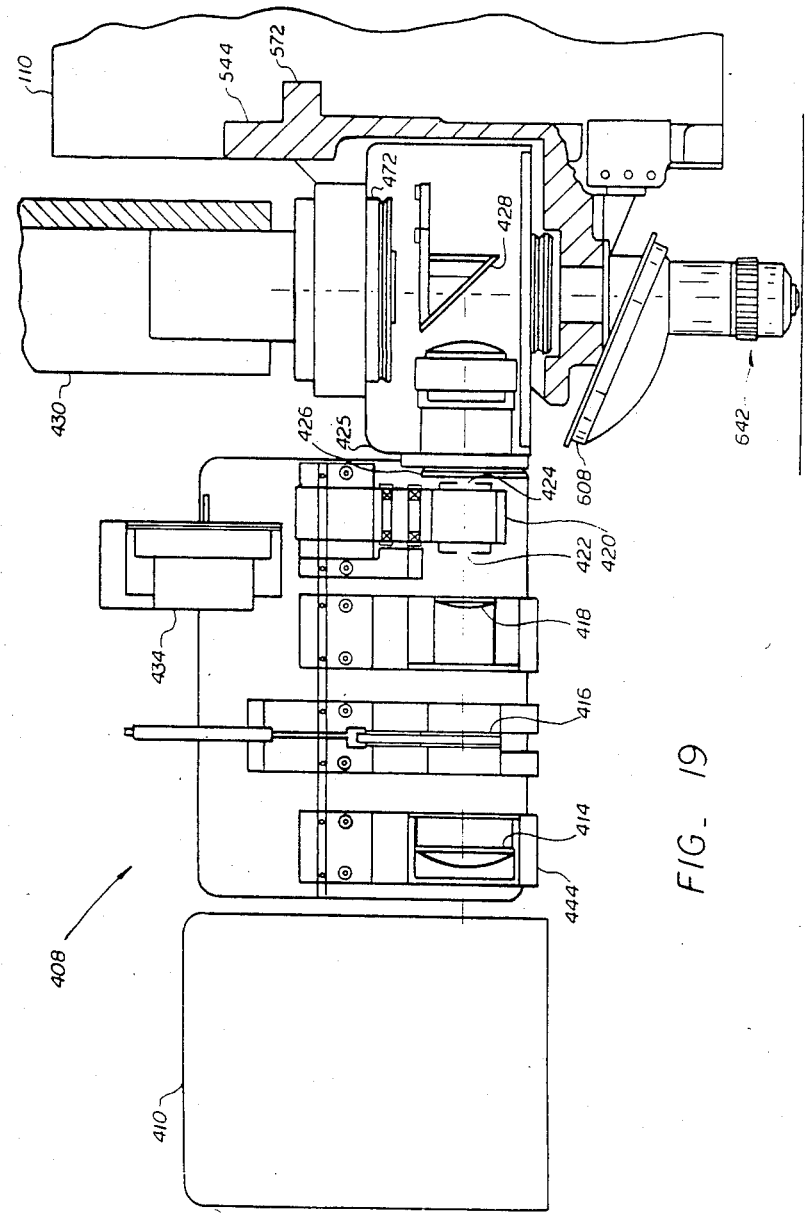
FIG. 20 illustrates how stepper motor (434) and pulley (438) drives aperture and pupil stop (420) by belt (440)

Three aperture/pupil stop combinations are automatically provided, one for brightfield (5×–50×), one for darkfield, and one for 100× for line width measurements. Referring now to FIG. 20, it may be seen how the filter 416 or pupil stop and aperture assembly 420 may be automatically adjusted to obtain the correct color filter or aperture pupil stop combination. A stepper motor 443 is mounted to the micro illuminator assembly 408 by means of mounting bracket 436. Under control of movement controller 52, stepper motor 443 turns drive shaft 437 which, in turn, causes pulley 438 to rotate. Drive belt 440 transfers the drive motion, e.g., to aperture/pupil stop 420. Means are also provided to accurately center the stop 420 so as to produce symmetrical images for line width measurement. The illuminator also contains the filter wheel which is used to provide different illumination wavelengths.

Above the turret 608, mounted in the optical rail 430, is the Leitz imaging lens assembly 425. The imaging lens assembly takes collimated light reflected from the wafer through the objective lens and forms an image at the field lens 472. The images at the field lens are relayed to the camera tube of the TV camera 38 via 100 mm focal length collimating lens 474, 200 mm focal length imaging lens 478, filter 480, and the pentaprism 122. By use of the 100 mm lens 474 and 200 mm lens 478 in combination in the optical path, the images at the field lens are magnified two times in passing through this portion of the optical path. Filter 480 has been added to further attenuate the red light used in the autofocus (automatic focusing system).

As noted hereinabove, the light images for the camera 38 are controlled by a shutter 37, and the shutter is closed so that during the time the wafer is being positioned no light reaches the camera. Once the stage 28 is steady and the objective focused, the shutter is opened so that the image is presented to the input of the camera. The camera beam current is controlled to allow integration of the light received during the entire time the shutter is open. Once the shutter is closed, the signal is read from the camera. The stage can move in parallel with this operation. Thus, the image is converted into an electrical representation on the face of the camera tube. The time during which the shutter is opened is programmable. The system computer program is used to automatically adjust this time so that sufficient light can fall on the tube to provide an adequate signal to noise ratio. It is only after the shutter is closed again that the controller 52 permits the electronics to provide current to scan the tube face of camera 38 and read out the stored image. During the first complete scan (raster) the image is read into high speed memory. Scanning is allowed to continue for several more complete rasters to remove the residual image after the shutter is again closed. In this way, several purposes are accomplished. The light can be integrated for a sufficient time to provide good signal to noise ratios even for low reflecting images or where narrow illumination apertures or bandwidth are employed. Also, the residual image can be effectively removed and does not get added to the wanted image. Further, the image can be read out in parallel with the next movement of the stage thereby increasing the testing speed.

Autofocus Electro-optics

Figure 22:
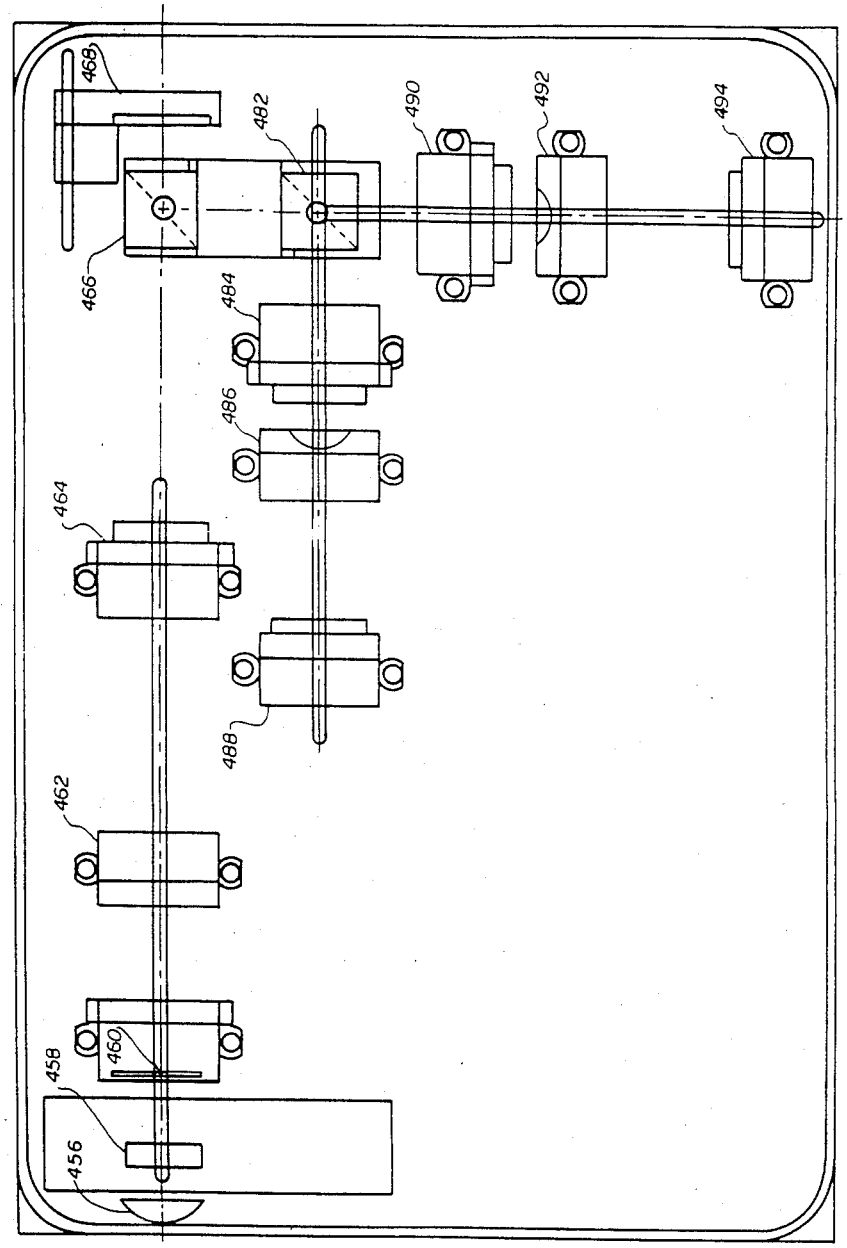
FIG. 22 is a block diagram illustrating the physical arrangement of the elements of the autofocus assembly.

An automatic focusing system for the objective lenses is provided, and comprises an electrical drive circuit, an autofocus optical system which provides a feedback signal to control the drive circuit and a flexure mounted turret assembly. Operation of the autofocus optical system may be understood by reference to FIGS. 18, 22–27. Referring to FIGS. 18 and 22, the general configuration of a preferred embodiment of an autofocus assembly may be seen. A lamp housing 450 includes a quartz halogen lamp 452 which is the light source for the autofocus system. The light is passed through collector lens 454 and condenser lens 456, and through a red filter 458, which passes light having wavelengths longer than 600 nanometers. The use of a red filter is to control the frequency of the light used and, thereby, permit selection of the autofocus optical signal from the optical signal used for the the micro inspection optical path 470.

The light is then applied to a pupil stop 460 which contains an eccentric pin hole aperture which offsets the image location. This offset is illustrated pictorially in FIG. 23. The image of the pupil stop on the objective back aperture is ½ the diameter of the smallest objective back aperture which is 100×. The position of the pupil is adjusted so that its image is just tangent to the 100× back aperture as shown in FIG. 23. This causes the returning image of the projection reticle, a schematic example is shown in FIG. 27, to move laterally as the microscope objective is moved up and down, i.e., in and out of focus. Thus, when the microscope is in focus the returning image of the projection reticle will fall on the reticle so that the image of the reticle pattern is coincident with the reticle pattern itself. As the objective lens is moved out of focus, this image will translate laterally relative to the projection reticle.

After passing through the pupil stop 460, the lamp light from lamp 452 passes through the pupil lens 462 (focal length 50 mm) and becomes collimated. It then passes through a projection reticle 464, located 100 mm from the pupil lens. The projection recticle 464 lies at the focal point of the 100 mm focal length autofocus imaging lens 468 which collimates the light coming from the reticle. The autofocus light, containing only wavelengths above 600 nm, then enters the micro inspection system optical path 470 via a dichroic mirror 476 which reflects the light having a wavelength longer than the 600 nm red light and transmits light with shorter wavelengths. Since the light from the reticle is collimated when it enters the optical path 470 in the collimated space between the 100 mm microscope collimating lens 474 and the 200 mm microscope imaging lens 478, the reticle image is focused on the wafer when the microscope is in focus.

The 100 mm autofocus imaging lens 468 is located with the image of the back aperture of the objective at its focal point. This image is than collimated between the 100 mm imaging lens and the 50 mm pupil lens 462 and brought to a focus at the pupil stop 460 located at the focal point of the 50 mm pupil lens 462. Thus, the pupil stop 460 is imaged on the back aperture of the microscope objective and vice versa.

The image of the pupil stop on the objective back aperture is one-half the diameter of the smallest objective back aperture (100×). The position of the pupil is adjusted until its image is just tangent to the 100× back aperture, with it centered vertically above the optical axis. It is not necessary that the aperture be vertically above center, but it is necessary that it be off axis, i.e., in a position to control the direction of rotation of the return image. Thus, proper positioning causes the returning image of the projection reticle to move laterally as the microscope moves up and down, in and out of focus. The movement of the image of the projection reticle with respect to the projection reticle will depend upon how the image is affected by elements in the optical path. For example, the movement may be vertical with respect to the right mask and horizontal with respect to the left mask. The direction of movement will be such as to increase the occulsion for one while decreasing the occulsion of the other as the objective lens is moved from a position of focus. However, in FIG. 24 only vertical movement is shown, it being understood that this is to illustrate the effect of the translation and is not a limitation. This image movement is such that the right and left masks provide equal light outputs when the lens is in focus. The reflected reticle image is transferred from the micro inspection optical path 470 to the autofocus path by dichroic mirror 476. Fifty-percent of the autofocus red light returning from the wafer is split out of the main beam by beam splitter 466 stationed between the autofocus imaging lens 468 and the projection reticle 464. This split-off light is then split into two equal beams by a second fifty-percent beam splitter 482 to left and right light sensing circuits.

In the left light sensing circuit, a mask 484 and detector lens 486 provide variable light input to a photodetector 488. The right sensing circuit comprises mask 490 and detector lens 492 which provides a variable light input to a photodetector 494. The detector lenses 486 and 492 each focus the collimated pupil light from the 100 mm lens 468, respectively, on photo detectors 488 and 494, i.e., the pupil is actually imaged onto the surface of the associated detector. Detectors 488 and 494 each separately convert the separate light inputs into electrical signals representative of the magnitude of the light input and these electrical signals are applied to inputs of comparator 500 via paths 496 and 498, respectively. The amplitude of the electrical signals applied to comparator 500 depends upon the amount of light passing through the right or left mask. By substracting the electrical signals, the electrical output signal will be zero when the objective lens is in focus, i.e., the electrical signals are equal. As the objective moves in the negative direction from focus, the reticle images both move down. When in focus, an equal portion of each returned image is occluded, in one image the top portion of the return image is occulded, in the other the bottom portion is occulded. The return masks may be adjusted to provide 30%, 50% or 90% occulsion. Only the 30% occulsion is illustrated in FIG. 24 to avoid confusion in the drawing. The electrical output for the different amounts of occulsion is illustrated in FIG. 25. It is to be understood that as images go out of focus, the light passing through one mask will increase while that passing through the other mask will decrease. The reverse situation occurs when the direction of motion of the objective changes from the direction of focus. The signal output from comparator 500 is essentially linear about zero, as shown in FIG. 26, and is applied to a stepper motor 576 which provides vertical drive through a lever system to the movable turret support member 544.

Because of the difference in focal length of the optical system at the different wavelengths used for the imaging and focusing tasks, the position of focus may be different. This can be partially corrected by positioning the optical components, however, because several different objectives are used with different color correction, electronic offset may be required to focus the image on the camera. This may be achieved by first focusing using the normal autofocus system described above and then offsetting the position of the objective to the required focus for the camera. This will be a fixed distance away from the normal focus. This can be achieved by counting pulses on an encoder connected to the mechanical drive as the mechanical system is essentially backlash and friction free. Such an encoder may be included, for example, with motor 576. An offset signal is stored in memory and is applied as a series of digital pulses to operate the encoder. Alternatively, this can be done by setting the necessary electrical offset in the autofocus system. In this latter case, the intensity of the returned signal changes depending upon the reflectivity of the wafer and the focus illumination intensity. The gain, G, of the system near focus is linear and can be measured by stepping (moving away from focus) a fixed distance, d, and measuring the voltage change v over the required target area on the wafer. Circuits for providing the motion and measurement are well known and, in a preferred embodiment, are effecuated by control and data storage 46, in conjunction with the auofocus system. If the required offset to obtain best focus is X, the offset voltage $V_o$ is given by $V_o = X \cdot v/d$. This is based on the variation in the light returning from the wafer and is compensated for by using the sum of the reflected signals with the wafer in place minus the background readings with no wafer in place to normalize the difference signal.

The autofocus system is capable of tracking focus while the stage 28 moves. However, during motion the focus is positioned to give zero offset. As another alternative, the compensation may be because the reflectivity of the wafer is changing, depending upon the geometry, and so the required offset voltage for best focus also changes. The null position remains a fixed distance from the wafer as the signal to both sensors changes at the same rate.

The autofocus system would work with a single hole or occlusion in the projection reticle (and a similar pair, i.e., hole and occlusion in the return path). The purpose of using multiple images is to avoid the defocus problem associated with an image positioned across an edge which has different reflectivity on either side. This would cause some defocusing in a stationary image. Ideally, these images should be randomly scattered across the reticles.

Referring now to FIGS. 22, 27–29, some of the physical characteristics of the electro optical circuit employed in the autofocus mechanism may be understood. The physical arrangement of the elements is shown in FIG. 22 and it is important to notice the eccentricity of the pin hole aperture 460, which is of critical importance to the autofocus optical analysis. Referring to FIG. 27, a typical optical module mount 510 is illustrated. The optical module 514 is shown holding the projection reticle 464 and the assembly includes a theta adjust lever 516. Referring to FIGS. 28 and 29, which are front and side elevation views of the adjustable mounting assembly 518, the manner in which the adjustable lens mounting assembly 518B is flexure attached to assembly 518 may be seen. A parallelogram flexure assembly comprises upper and lower X-axis flexure arms 521A and 521B on either side and Y-axis flexure arms 523A and 523B at the top and bottom. From the drawing, it is apparent that screw 520 provides an X axis adjustment and, screw 522 provides a Y axis adjustment for the optical module 514. The adjustable mounting assembly 518B also includes an aperture 524 which is threaded and includes a theta locking screw (not shown). Access to the locking screw is via an aperture (not threaded) through 518 which is aligned with aperture 524. When the theta locking screw is backed out, the rotational or theta adjustment of the image holder 514 can be obtained by moving the theta adjust lever 516. Once the theta adjustment is proper, the theta locking screw is than tightened and the image holder is held in position. The attachable mounting assembly 518 rests on a guide member and the base 526 includes guide slots 530 to permit Z axis adjustment. The base is held in position by locking members 528.

Turret Adjust Assembly

Referring now to FIGS. 30–33, the manner in which the turret mounting assembly 540 provides the necessary vertical motion for focusing of an objective lens, and the manner in which the rotational movement of turret 608 is used to select the desired objective lens may be understood. The turret mounting assembly 540 includes a rigid part 542 which provides the fixed support for the non-moveable elements and those moveable elements which are used to provide the vertical motion for focusing and the rotational motions for objective lens selection. A moveable turret support portion 544 is attached to the rigid support part 542 by means of flexure assembly 546. A pair of flexure members 548 and 548A, each comprising a flat sheet of material which exhibits a certain degree of flexibility, provide the interconnection between the fixed and moveable parts of the turret assembly and guide the turret assembly along a nearly vertical path without allowing the objective lenses to tilt. The end portions of the flexure members 548 and 548A are attached by means of clamping plates 550 at the upper and lower ends of the turret assembly and to a corresponding portion of the rigid member back plate 542. Rigid member 542 is attached to aluminum casting 110 by suitable means (not shown). For the lower and upper flexure members, stiffening plates 554 and 556 are employed to sandwich the flexure members 548 and 548A so as to control the degree of flexure that may be readily obtained. It should be understood that the motion of the moveable turret support 544 is to be in the order of 0.015 inch. However, it is necessary to accomplish this motion without hysteresis or any frictional problems that may be associated with other types of drive systems. This is necessary because repeatability within about 0.05 micron is desired. By using the drive technique of this invention, the precision positioning desired is obtained.

As seen in the drawing, although similar stiffening plates 554 and 556 are employed with the flexure member 548 as are employed with 548A, an aperture is formed in the plates associated with flexure member 548 to accommodate support wire 570. The function of this wire will be discussed in more detail later.

As described hereinbelow, turret assembly 608 is mounted on a moveable turret support 544 that allows vertical motion under the control of a motor 576. In a preferred embodiment, a dc motor and an encoder are used to provide controlled drive. To obtain repeatability to within $2 \times 10^{-6}$ inches in the focus of the microscope, the turret support 544 is attached to the rigid member 542 of the inspection assembly by means of flexures. The weight of the assembly causes a downward force on the flexures which would force the turret support downward toward its lowest vertical position, and is augmented by a coil spring 573 which acts in tension to pull the support down. A position control lever lever arm 560 has a wire 570 attached thereto. The other end of the wire is attached to the moveable turret support 544 at the turret lift arm 572 by means of a clamp 574. The wire and lever arm act to pull turret support 544 up againt its weight and the force of coil spring 573.

In one embodiment of the invention the position control lever arm is flex supported as shown in FIGS. 30, 31, 32 and 33. At the proximal end, the position control lever lever arm 560 is attached to a cantilever support arm 562 by means of a flexure member 564. Flexure member 564 is attached at one end to cantilever support arm 562 by upper clamping plate 566 and at the other end to position control lever arm 560 by means of lower clamping plate 568. The distal or drive end, of the position control lever arm 560, is driven by vertical position motor 576, which is mounted on horizontal support 578 that is attached to the back plate 542. The shaft 580 from motor 576 is attached to micrometer (or lead screw) 584 at the screw end 586 by means of a rigid coupling member 582. The micrometer frame (or lead screw nut) 588 is connected to drive member 590. Thus, as the motor 576 turns under control of the autofocus signal input, the precise position provided by the motor 576 is, in turn, used to drive a precise instrument so as to provide very small precise almost linear steps for positioning the lever arm 560. The position control lever arm 560 is driven by a flexure drive link 592 which is clamped at one end to the drive member 590 by means of clamping plate 596 and to the distal end of position control lever arm 560 by clamping plate 594. In order to insure that the vertical motion stays within acceptable limits, a limit flag 598 is attached to drive member 590. Lower and upper limit optical detectors 600 and 602, respectively, are positioned to intercept the flag 598 so as to stop the vertical motion when the upper or lower limit is reached.

In a preferred embodiment of the invention, the proximal end of position control lever arm 560A is supported by crossed flexures as illustrated in FIGS. 30A and 30B. A single vertical flexure 564A is used and is positioned intermediate two horizontal flexure 564B and 564C which are each about one-half the width of 564A. The upper clamping plate 566A is L shaped and is designed to accept a horizontal clamping plate 566B which clamps one end of each of the horizontal flexure 564B and 564C. The other end of each horizontal flexure is clamped to position control lever arm 560A by a horizontal clamping plate 566C. This plate acts to retain horizontal compliance while allowing the lever arm 560A to pivot about the line of intersection between 564B and 564A.

At the distal or drive end, a new pivot structure replaces the flexure drive link 592. This structure acts to eliminate side loads and bending moments on lead screw 586. This eliminates variability of the drag and minimizes the drag. As shown in FIG. 30A, the pivot structure is positioned between horizontal support 578 and the under side of the distal end of position control lever arm 560A. Horizontal support 578 is clamped to the nut that travels vertically on lead screw 586 as the lead screw is rotated. A bottom plate 593A includes a V-slot 595A which is aligned with V-slot 595B in floating plate 593B. A pair of balls one shown as 597A, are positioned in the aperture formed by V-slots 595A and 595B, and thus permits a small amount of "Y" direction travel. In line with the control lever 560A is a pair of V-slots, one in the upper surface of said floating plate 595B which is aligned with the V-slot in top plate 593C. A pair of balls 597B and 597C are positioned in this upper longitudinal V-slot and permit a small amount of travel in the "X" direction. The asembly is flexibly held together by four coil springs one adjacent each end of the two V-slot formed apertures. The top plate of this pivot structure is atached to the end of position control lever arm, and the movement force is then transmitted from the motor 576 (dc motor and encoder) to the turrent support structure 544 via support wire 570.

It will be understood that, by the use of the turret support flexure members, the cross flexure connection to the proximal end of position control lever arm 560, the use of the pivot structure at the drive end and the drive wire 570, sidewise motion as well as other motions that might otherwise adversely effect the positioning during focus operation have been substantially eliminated. Further, the manner in whch the flexure support members 548 are attached so as to support the moveable turret support 544 in relation to the fixed portion 542 is such that the motions other than vertical are substantially prohibited. As a follow-on with the avoidance of any sidewise thrust, the position control lever 560 has an aperture 604 at the distal end which is designed to allow passage of the thimble part 606 of micrometer 584. In a preferred embodiment of the invention, the drive movement for the moveable turret support member 544 provided the following characteristics. The flexure and the wire attachment to the turret assembly 544, in combination with the lever arm arrangement, provided a ratio of 31:1; and the stepper motor had a lead screw with 40 threads to the inch. By the use of this flexure mounting arrangement and drive system, the focusing mechanism exhibited a negligible hysteresis and provided a resolution of $2 \times 10^{-6}$ inch.

Although in a preferred embodiment, a moveable lens assembly has been used in the autofocus system, it should be understood that other arrangements could be employed. For example, the lens position could be held fixed and the stage could be moved up or down to bring the wafer into focus.

Object Lens Handoff

Another problem associated with the automatic micro inspection techniques is the handoff between objective lenses. The inspection of a particular location within a die of the wafer requires that the objective lenses that are sequentially used to provide the different magnifications necessarily must be positioned to a repeatability of less than one micron from one objective to the next. While a precise drive system might provide the necessary hand-off positioning from one objective lens to the next, a major problem with such a device is the slow speed at which it must operate in order to accomplish the desired result.

In the present invention, a standard turret 608 is modified to mount V-slots such as 612 and 614, which are made of a hardened material and can be adjusted in position to a precise location. One such V-slot is used for each objective lens, however, only two have been shown. The V-slots are positioned on the periphery of the turret 608 as shown and are designed to take a detent alignment ball 610. While the use of detents have been previously employed such use has involved the detent all riding on the periphery of the device during rotation. In accordance with this invention, the detent ball is separated from the peripheral surface of the turret when the turret is in motion. In fact, the ball is removed from the V-slot prior to the time at which the turret drive stepper motor 644 is actuated. By so doing, the pressure of the detent ball 610 on the peripheral surface of turret 608 is removed, thus allowing the turret to move at a more rapid rate and at the same time the wear on both the turret and the ball is essentially eliminated. Detent ball 610 is bonded to detent lever arm 616 which is attached to the moveable turret support 544 via flexure 617 (see FIG. 33). Flexure 617 allows detent lever arm 616 to pivot about a vertical axis relative to moveable turrent support 544. A centering spring 620 is positioned in retaining apertures 618 and 624, the latter being in the detent pressure arm 622. By this arrangement, lever arm 616 is under constant bias pressure to force detent alignment ball 610 against the periphery of the turret 608.

When it is desired to change the objective lens in a handoff arrangement, pressure is applied via the objective alignment wire 626 which pulls the lever arm 616 and consequently detent alignment ball 610 out of a V-slot, such as 614, and away from the periphery of the turret 608. This is accomplished in the following manner. Detent stepper motor 636 provides the drive to motor shaft 634 which is attached via coupling assembly 632 to the mounting screw 630. Mounting screw 630 secures the inner race of ball bearing 628 to assembly 632. In the coupling assembly 632, it is noted that the mounting scew 630 is off-set from that of the centered motor shaft 634, thereby providing an eccentric drive. Wire 626 is attached to the outer race of bearing 628. Thus, by rotation of the motor shaft 634 under control of the stepper motor 636, tension may be applied to wire 626 whereby the lever arm 616 is pulled away from the periphery of turret 608. The motor rotates 180 degrees to remove the detent ball 610 from V-slot 612. Alternatively, the wire 626 may be in a slack condition which allows the lever arm 616 to force detent alignment ball 610 against the periphery of the turret 608, and avoids affecting the preload of the detent ball 610 as the turret moves up and down to focus.

An eccentric detent flag 638 is attached to the coupling assembly 632 by means of mounting screw 630. When in position such as shown in FIG. 31, wire 626 would be slack allowing the detent ball 610 to rest in V-slot 614. Eccentric 638 is not in position to block optical detector 640 and the assembly is in a "ready" status. When an objective handoff is to be accomplished, the stepper motor 636 is actuated by movement controller 52 causing tension to be applied to wire 626 which forces lever arm 616 away from the periphery of the turret 608. At the same time, flag 638 moves to a position which it blocks the light flow through the path of the optical detector 640 thereby stopping the stepper motor in a position under which wire 626 is in tension. The motor rotates 180 degrees during this process. As will be explained in detail hereinbelow, the turret is then driven to the next objective lens position. At that time, stepper motor 636 is reactivated causing the tension on wire 626 to be released and moving eccentric 638 so that it no longer blocks the light to optical detector 640. When lever arm 616 comes toward the periphery of turret 608, detent alignment ball 610 strikes a V-slot, such as 612 forcing the turret 608 to move into a precisely aligned position.

The manner in which the turret 608 is driven from one objective position to the next in a hand-off situation may be understood by reference to FIG. 32 in conjunction with the following discussion. Once the detent alignment ball 610 has been withdrawn from the V-slot, stepper motor 644 is actuated and rotates shaft 646 which is coupled to a flexible coupling 650, the rotation being through an aperture 648 of the back plate 542. The motion is then transmitted via drive shaft 652 to a second flexible coupling 654 and thence via shaft 656 which passes through a bearing 658 in turret support 544 to a standard bevel drive gear 660 on the turret head or nose piece. The use of the two flexible couplings is to allow for freedom of movement of the moveable turret support member 544 with respect to the rigid support member 542. A flag 662 is attached to an alternate drive output of stepper motor 644 and the gear ratio is such that one full rotation of the stepper motor 644 drives the turret from one objective to the next adjacent objective lens. This is a good approximation and is done rapidly. The detent mechanism provides precise alignment.

Once stepper motor 644 is activated, it will continue to drive the turret until the flag 662 interrupts the light path of optical detector 664. At that time, the drive motion from the stepper motor will cease, and the stepper motor 644 is deenergized. However, the detent stepper motor 636 will now be reactivated so as to release the tension on wire 626 and thus allow detent alignment ball 610 to drop into the associated V-slot on the periphery of the turret 608. Because stepper motor 644 is deenergized, the detent can move the turret drive as required to obtain exact positioning. By using this combination for the turret drive and alignment, the turret is allowed to run quickly between adjacent objective lenses. Following this, tension on wire 626 is released and bias or centering spring 620 drives the ball into the V-slot forcing the turret 608 into a precise alignment. This positions the objective lens in the field of view of the previous objective lens and repeats to within 1 micron in position each time. The exact position of each objective lens is adjusted to 2-5 micron, but the position is repeatable to within less than one micron. In an alternative embodiment, the V-slots are fixed and are capable only of accurate repeatability rather than absolute positioning accuracy. The same method of switching objectives is used as described above. However, accurate positioning is obtained by slight adjustment of the X-Y stage 28 based on positioning corrections stored in the computer.

To suppress mechanical resonance in the autofocus system, a damper mechanism has been provided. One embodiment of a damper mechanism is shown in FIG. 32. This comprises a well 668, a damper 670 and a damper support arm 672. The well 668 containing silicone fluid 674 is attached to the moveable turret support member 544. The damper support arm 672 is attached to the inner face of the rigid member 542. Because of the viscosity of the silicone fluid 674, resonances in the focus drive mechanism are suppressed.

The damper also helps to decrease motion caused by the drive mechanism for the turret 608 and the other drive mechanism. This is necessary because line width is measured to within 1/20th of a micron and it is, of course, necessary to hold the vibrations to a magnitude which is less than this amount.

A preferred embodiment of a damper mechanism is shown in FIG. 32A. A well 668A containing silicone fluid 674 is attached to the moveable turret support 544. The damper support arm 672 is attached to the inner face of the rigid member 542 as shown in the embodiment (see FIG. 32). In the bottom of the well 668A is a layer of closed cell foam 669 which compresses under presure during damping action so as to accomodate displacement of the fluid. There are a plurality of spaced-apart thin plates 671 rising upwardly from the floor of well 668A to a level below the height of the sidewalls of said well. The damper 670A consists of a horizontal plate 673 which is attached to the support arm 672, and a plurality of downwardly extending thin plates 675 which are positioned between the upwardly extending plates 671. This combination provides exceptional damping action following turret movement which results from focus up and down motion or the shifting from one objective to another which includes the up and down as well as rotary motion effects.

While this invention has been described in the light of preferred embodiments thereof, it is contemplated that modifications thereof will become apparent to those skilled in the art after having read the preceeding description. It is therefore intended that the following appended claims be interpreted as covering all such modifications as fall within the true spirit and scope of this invention.

What is claimed is:

1. In an optical inspection system that includes two physically separated optical inspection stations, apparatus for moving a test object from one station to the other and selectively positioning the object at each inspection station, which comprises:
   support means for providing movement for predetermined distances in each of two orthogonal directions of travel capable of only the range of motion required at each inspection station independently; and
   object transport means interconnected with said support means for shifting said object from one inspection station to the other.

2. Apparatus as set forth in claim 1 wherein said support means comprises a small stage means capable of only the limited range of motion required to view the surface of the test object with travel centered on the optical axis of the associated test station.

3. Apparatus as set forth in claim 2 wherein said transport means comprises:
   means for holding said object; and
   means for rotating said holding means.

4. Apparatus as set forth in claim 3 wherein said transport means further comprises:
   a transport arm having one and other ends;
   means for pivotally interconnecting one end of said transport arm to said stage means;
   drive means for moving said transport arm; and
   link means for interconnecting said drive means with said transport arm for pivotally driving said transport arm from one inspection station to the other.

5. Apparatus as set forth in claim 4 wherein said means for rotating comprises:
   a stepper motor having a drive shaft extending therefrom;
   a pulley attached to said drive shaft;
   a turntable interconnected with said transport arm and resting on said stage means during the tests and spaced therefrom by air bearings during rotational motion; and
   belt drive means adapted for interconnection with said pulley for rotating said turntable.

6. Apparatus as set forth in claim 5 wherein said means for holding said object comprises:
   a cylindrically shaped member having an end wall in a horizontal plane;
   an aperture centrally formed in said end wall and extending vertically downward therethrough;
   means for attaching said cylindrically shaped member to said turntable so as to be concentric therewith; and
   means for applying a vacuum to said aperture so as to hold said object on said cylindrically shaped member during the inspection.

7. Apparatus as set forth in claim 6 wherein said transport arm is supported above said stage means by air bearings during the time when said transport arm is pivotally driven from one inspection to the other.

8. Apparatus as set forth in claim 7 wherein stage means comprises:
   a crossed-roller X-Y stage;
   a base plate attached to said X-Y stage; and
   stop means adapted for attachment to said base plate for stopping said transport arm.

9. Apparatus as set forth in claim 8 wherein said link means comprises:
   a first member having one end eccentrically connected to said drive means, and having an other end;
   a second member having one end adapted for pivotally driving said transport arm and having an other end; and
   spring-loaded means for interconnecting with said other ends of said first and second members so as to maintain constant pressure on said transport arm when said arm is pressed against said stop means.

10. Apparatus as set forth in claim 4 wherein said transport arm is supported so as to ride above said stage means and about said pivotal interconnecting means.

11. Apparatus as set forth in claim 10 wherein said stage means comprises:
    a crossed roller X-Y stage;
    a base plate attached to said X-Y stage; and
    stop means adapted for attachment to said base plate for stopping said transport arm.

12. Apparatus as set forth in claim 11 wherein said link means comprises:
    a first member having one end eccentrically connected to said drive means, and having an other end;
    a second member having one end adapted for pivotally driving said transport arm and having an other end; and
    spring-loaded means for interconnecting with said other ends of said first and second members so as to maintain constant pressure on said transport arm when said arm is pressed against said stop means.

13. Apparatus as set forth in claim 12 wherein said link means further comprises:
    a first upright member and a first transverse member formed on said other end of said first member;

a second transverse member in parallel with said first transverse member and a longitudinal member having a second upright member in parallel with said first upright member and an L-shaped member having a longitudinal portion extending above and over said first upright member and including a downward extending portion adjacent said first upright member and in parallel therewith all of which is formed on the other end of said second member; and flexure means for interconnecting the distal ends of said first and second transverse members.

14. Apparatus as set forth in claim 13 wherein said spring-loaded means comprises:

first and second threaded apertures, respectively, in said second upright member and said downwardly extending portion; and first and second spring means adapted for insertion in said first and second threaded apertures, said spring means extending through said apertures and abutting against opposite upright faces of said first upright member to allow compression of said drive link when said drive link is forced against said stop means.

15. Apparatus as set forth in claim 14 wherein said means for rotating comprises:

a stepper motor having a drive shaft extending therefrom;

a pulley attached to said drive shaft;

a turntable interconnected with said transport arm and spaced therefrom by air bearings; and belt drive means adapted for interconnection with said pulley for rotating said turntable.

16. Apparatus as set forth in claim 15 wherein said means for holding said object comprises:

a cylindrically shaped member having an end wall in a horizontal plane, the diameter of said end wall being smaller than that of said object;

an aperture centrally formed in said end wall and extending vertically downward therethrough;

means for attaching said cylindrically shaped member to said turntable so as to be concentric therewith; and means for applying a vacuum to said aperture so as to hold said object on said chuck during the inspection.

17. Apparatus as set forth in claim 16 wherein said object is a patterned wafer.

18. In a patterned wafer automatic inspection system for providing separate macro and micro inspection stations, apparatus for positioning a wafer in each inspection station and moving the wafer from one inspection to the other other, which comprises:

an X-Y stage;

a base plate fixedly mounted on said X-Y stage;

a first stop located adjacent the left side of said base plate;

a second stop located adjacent the right side of said base plate;

a macro-micro transport arm being pivotally interconnected with said base plate, said arm riding on air bearings above said base plate so as to be free to move;

drive means for moving said transport arm;

link means for interconnecting said drive means and said transport arm whereby said arm is driven against either one of said first or second stop;

a turntable centrally interconnected with said arm and supported on air bearings so as to be free to rotate without moving said arm; and a vacuum chuck centrally located on said turntable for holding said wafer.

* * * * *